United States Patent
Sathyamurthy et al.

(10) Patent No.: US 12,439,556 B2
(45) Date of Patent: Oct. 7, 2025

(54) MEMS-BASED SYSTEM FOR COOLING A VAPOR CHAMBER

(71) Applicant: Frore Systems Inc., San Jose, CA (US)

(72) Inventors: Prabhu Sathyamurthy, San Jose, CA (US); Suryaprakash Ganti, Los Altos, CA (US); Seshagiri Rao Madhavapeddy, La Jolla, CA (US); Vikram Mukundan, San Ramon, CA (US); Narayana Prasad Rayapati, Mountain View, CA (US)

(73) Assignee: Frore Systems Inc., San Jose, CA (US)

( * ) Notice: Subject to any disclaimer, the term of this patent is extended or adjusted under 35 U.S.C. 154(b) by 78 days.

(21) Appl. No.: 18/083,414

(22) Filed: Dec. 16, 2022

(65) Prior Publication Data
US 2023/0200011 A1 Jun. 22, 2023

Related U.S. Application Data

(60) Provisional application No. 63/291,760, filed on Dec. 20, 2021.

(51) Int. Cl.
*H05K 7/20* (2006.01)

(52) U.S. Cl.
CPC ..... *H05K 7/20309* (2013.01); *H05K 7/20327* (2013.01); *H05K 7/20381* (2013.01)

(58) Field of Classification Search
CPC .......... H05K 7/20309; H05K 7/20327; H05K 7/20381
USPC ....................................................... 361/700
See application file for complete search history.

(56) References Cited

U.S. PATENT DOCUMENTS

| | | | | |
|---|---|---|---|---|
| 5,758,823 | A * | 6/1998 | Glezer | F21V 29/70 239/11 |
| 5,894,990 | A * | 4/1999 | Glezer | F15C 5/00 257/E23.093 |
| 6,123,145 | A * | 9/2000 | Glezer | F15C 5/00 257/E23.093 |
| 7,134,486 | B2 * | 11/2006 | Santiago | B01D 67/0062 257/E23.098 |
| 7,843,695 | B2 * | 11/2010 | Yang | F28D 15/0233 257/713 |
| 8,584,735 | B2 * | 11/2013 | Gerlach | F28F 13/187 165/80.3 |
| 10,085,363 | B2 * | 9/2018 | Refai-Ahmed | B23P 15/26 |
| 10,698,458 | B2 * | 6/2020 | Delano | F28D 15/0233 |
| 10,788,034 | B2 * | 9/2020 | Ganti | F04B 43/046 |
| 11,356,542 | B2 * | 6/2022 | Sathyamurthy | H04M 1/026 |
| 11,464,140 | B2 | 10/2022 | Yalamarthy | |
| 11,510,341 | B2 | 11/2022 | Mukundan | |
| 11,796,262 | B2 | 10/2023 | Mukundan | |
| 2002/0080584 | A1 * | 6/2002 | Prasher | H01L 23/427 257/E23.088 |
| 2002/0118511 | A1 * | 8/2002 | Dujari | H01L 23/427 174/16.3 |
| 2004/0190305 | A1 * | 9/2004 | Arik | F21V 29/763 362/555 |

(Continued)

*Primary Examiner* — Anatoly Vortman
(74) *Attorney, Agent, or Firm* — Van Pelt, Yi & James LLP

(57) ABSTRACT

A server system is described. The server system includes a vapor chamber in thermal communication with a plurality of heat sources and an array of microelectromechanical system (MEMS) jets arranged to cause a fluid to impinge on a surface of the vapor chamber.

16 Claims, 18 Drawing Sheets

120 AirJet Tiles on 5 mm 3D Finned-Vapor chamber (108 x 100 x 90 mm)

(56) References Cited

U.S. PATENT DOCUMENTS

| | | | | |
|---|---|---|---|---|
| 2008/0041574 | A1* | 2/2008 | Arik | H01L 23/4735 |
| | | | | 165/80.2 |
| 2008/0068802 | A1* | 3/2008 | Chen | F28D 15/046 |
| | | | | 257/E23.088 |
| 2011/0024092 | A1* | 2/2011 | Gerlach | F28D 1/05333 |
| | | | | 165/104.34 |
| 2011/0114287 | A1* | 5/2011 | Arik | H05K 7/20209 |
| | | | | 165/185 |
| 2012/0063091 | A1* | 3/2012 | Dede | H05K 7/20927 |
| | | | | 174/15.1 |
| 2014/0202665 | A1* | 7/2014 | Paschkewitz | H01L 23/427 |
| | | | | 165/104.26 |
| 2015/0289413 | A1* | 10/2015 | Rush | G06F 1/20 |
| | | | | 165/53 |
| 2015/0342088 | A1* | 11/2015 | Refai-Ahmed | H05K 7/20263 |
| | | | | 165/104.31 |
| 2017/0196120 | A1* | 7/2017 | Oprins | H05K 7/20272 |
| 2018/0187672 | A1* | 7/2018 | Tanaka | F04B 45/04 |
| 2020/0053905 | A1* | 2/2020 | Ganti | F04D 33/00 |

\* cited by examiner

120 AirJet Tiles on 5 mm 3D Finned-Vapor chamber
(108 x 100 x 90 mm)

Temperature on PCB, GPU at 560W

Flow through the AirJet modules

MEMS-BASED SYSTEM FOR COOLING A VAPOR CHAMBER

CROSS REFERENCE TO OTHER APPLICATIONS

This application claims priority to U.S. Provisional Patent Application No. 63/291,760 entitled MEMS-BASED SYSTEM FOR COOLING A VAPOR CHAMBER filed Dec. 20, 2021 which is incorporated herein by reference for all purposes.

BACKGROUND OF THE INVENTION

As computing devices grow in speed and computing power, the heat generated by the computing devices also increases. Various mechanisms have been proposed to address the generation of heat. Active devices, such as fans, may be used to drive air through larger computing devices, such as laptop computers or desktop computers. Passive cooling devices, such as heat spreaders, may be used in smaller, mobile computing devices, such as smartphones, virtual reality devices and tablet computers. However, such active and passive devices may be unable to adequately cool not only mobile devices and larger devices, but may also be inadequate for high power computing systems, such as server systems. Server systems utilize multiple high power processors. In addition, servers are typically housed in racks that carry multiple servers systems. Consequently, high power systems may be desired to be placed in proximity to other high power systems while maintaining their heat dissipation. Consequently, additional cooling solutions for computing devices, particularly high power dissipation computing devices, are desired.

BRIEF DESCRIPTION OF THE DRAWINGS

Various embodiments of the invention are disclosed in the following detailed description and the accompanying drawings.

DETAILED DESCRIPTION

Figure 1A:
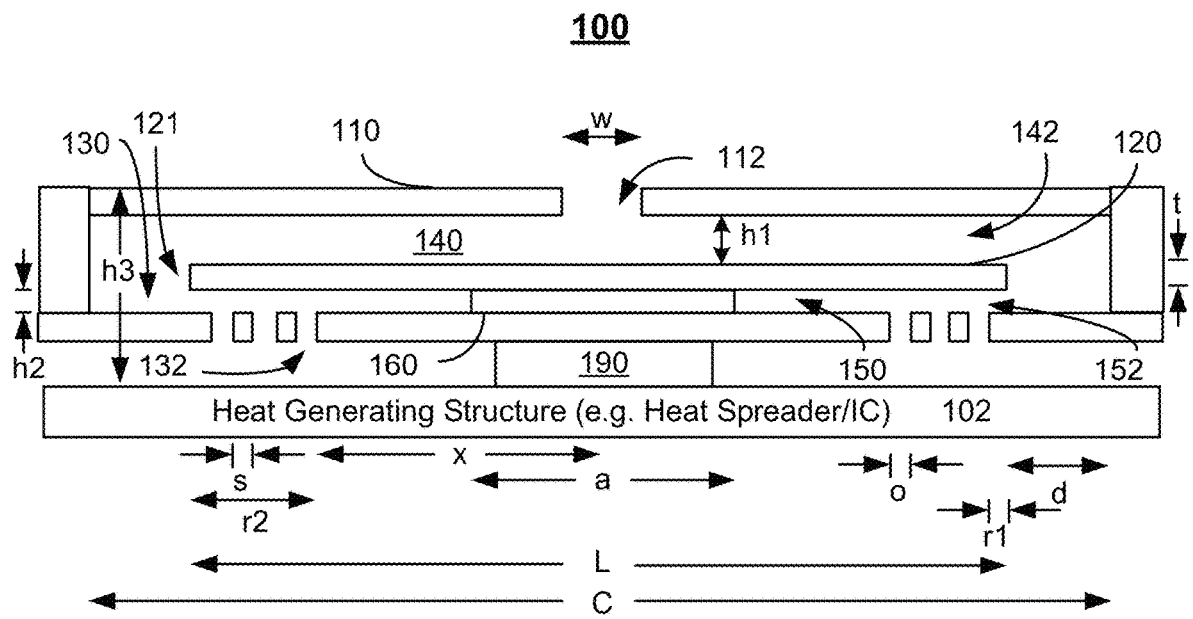
FIGS. 1A-1G depict an embodiment of an active MEMS cooling system including a centrally anchored cooling element.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As semiconductor devices become increasingly powerful, the heat generated during operations also grows. For example, processors for mobile devices such as smartphones, tablet computers, notebooks, and virtual reality devices can operate at high clock speeds, but produce a significant amount of heat. Because of the quantity of heat produced, processors may run at full speed only for a relatively short period of time. After this time expires, throttling (e.g. slowing of the processor's clock speed) occurs. Although throttling can reduce heat generation, it also adversely affects processor speed and, therefore, the performance of devices using the processors. As technology moves to 5G and beyond, this issue is expected to be exacerbated.

Larger devices, such as laptop or desktop computers include electric fans that have rotating blades. The fan that can be energized in response to an increase in temperature of internal components. The fans drive air through the larger devices to cool internal components. However, such fans are typically too large for mobile devices such as smartphones or for thinner devices such as tablet computers. Fans also may have limited efficacy because of the boundary layer of air existing at the surface of the components, provide a limited airspeed for air flow across the hot surface desired to be cooled and may generate an excessive amount of noise. Passive cooling solutions may include components such as a heat spreader and a heat pipe or vapor chamber to transfer heat to a heat exchanger. Although a heat spreader somewhat mitigates the temperature increase at hot spots, the amount of heat produced in current and future devices may not be adequately addressed. Similarly, a heat pipe or vapor chamber may provide an insufficient amount of heat transfer to remove excessive heat generated.

Furthermore, high power computing systems, such as server systems, are desired to be cooled. Server systems utilize multiple high power processors. For example, some server systems use four processors for which at least two hundred Watts per processor (eight hundred Watts per server) is desired to be dissipated. Some server systems are desired to dissipate four hundred Watts per processor (one thousand six hundred Watts per server). Future generations of servers may use higher power and/or more processors for which more power is desired to be dissipated. In addition, servers are typically housed in racks that carry multiple servers systems. Consequently, high power systems may be desired to be placed in proximity to other high power systems while maintaining their heat dissipation. Thus, to achieve optimum performance in such systems, high power dissipation is desired.

Current server systems typically use fans or liquid cooling for power dissipation. Fans are limited in their ability to dissipate heat. For example, the volume and speed of the air flow from a set of fans (e.g. five) may be insufficient to provide more than approximately eight hundred Watts of heat dissipation. Thus, fans may not be used in higher power processor systems. Further, fans are generally tall. For example, a server utilizing fans capable of dissipating eight hundred Watts may use a fan system that is at least forty four millimeters in height. Other fan systems may be sixty millimeters to eighty millimeters in height. Thus, the server system employing fans may be larger than desired. Liquid cooling provides higher efficiency heat dissipation. However, the use of liquid in connection with electrical systems, such as server systems, may be less desirable. Further, heated fluid is generally routed to an external chiller and then returned to the server system. Consequently, components outside of the server system (e.g. external ducting to and from the chiller) may be required. Thus, other techniques for providing heat dissipation for high power systems are still desired.

A server system includes a vapor chamber and an array of microelectromechanical system (MEMS) jets. The vapor chamber is in thermal communication with a plurality of heat sources. The array of MEMS jets is arranged to cause a fluid to impinge on a surface of the vapor chamber. Each MEMS jet in the array of MEMS jets may have a height of not more than 1.5 millimeter. In some embodiments, the array of MEMS jets includes at least 720 jets and dissipates at least 1400 W. The fluid may be air. The vapor chamber may include fins having at least a portion of the surface. Each of the fins may be parallel another of the fins. The fins may be oriented parallel to a heat source surface or perpendicular to the heat source surface.

In some embodiments, the array of MEMS jets includes cooling cells. Each cooling cell includes a cooling element and an orifice plate including orifices therein. The cooling element is configured to drive the fluid through the plurality of orifices, forming a plurality of fluid jets. In some embodiments, the jets have a velocity of greater than 30 meters per second. The vapor chamber has a first surface and a second surface opposite to the first surface in some embodiments. The array of MEMS jets is configured to cause the fluid to impinge on the first surface and the second surface. In some embodiments, the system further includes a duct system configured to direct the fluid from outside of the server system to the array of MEMS jets and to direct heated fluid from the vapor chamber to the outside of the server system.

A system including a vapor chamber and an array of cooling elements is described. The vapor chamber is in thermal communication with a plurality of heat sources. The array of cooling elements is configured to undergo vibrational motion when actuated to drive a fluid to impinge on a surface of the vapor chamber. The array of cooling elements is configured to dissipate at least 800 Watts when actuated. The array of cooling elements may be configured to dissipate at least 1600 Watts when actuated. In some embodiments, the array of cooling elements is configured to drive the fluid through orifices in a least one orifice plate when actuated. Thus, fluid jets having a velocity of at greater than 30 meters per second may be formed. In some embodiments, the array of cooling elements has a height of not more than 1.5 millimeter.

In some embodiments, the vapor chamber has a first surface and a second surface opposite to the first surface. The array of cooling elements is configured to cause the fluid to impinge on the first surface and the second surface. The vapor chamber may include fins having at least a portion of the surface the fluid impinges on. The system may further include a duct system. The duct system is configured to direct the fluid from outside of the server system to the array of MEMS jets and to direct heated fluid from the vapor chamber to the outside of the server system. The system may include at least 720 cooling elements, include at least 720 cooling elements, and dissipates at least 1400 W.

A method for providing a cooling system is described. The method includes providing a vapor chamber in thermal communication with a plurality of heat sources. The method also includes providing an array of MEMS jets coupled with the vapor chamber and arranged to cause a fluid to impinge on a surface of the vapor chamber. In some embodiments, providing the array of MEMS jets includes providing cooling cells. Each cooling cell includes a cooling element and an orifice plate including a plurality of orifices therein. The cooling element is configured to drive the fluid through the orifices, forming fluid jets.

Figure 1B:
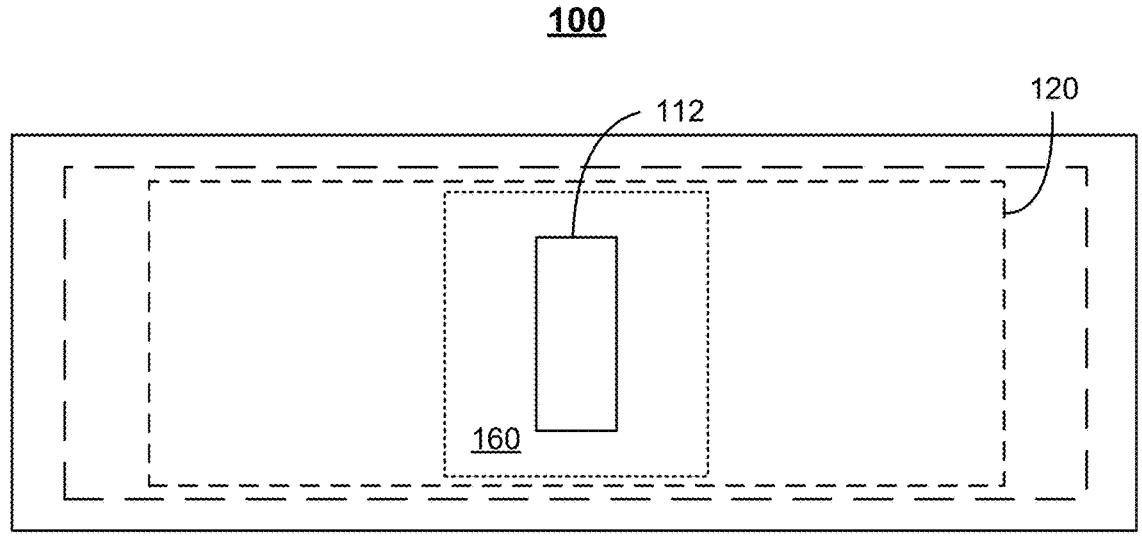
Figure 1C:
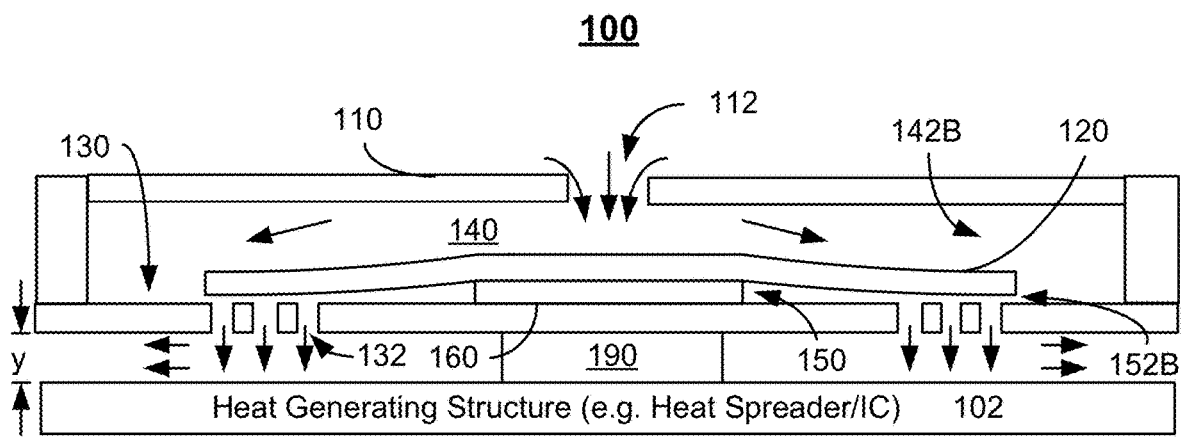
Figure 1D:
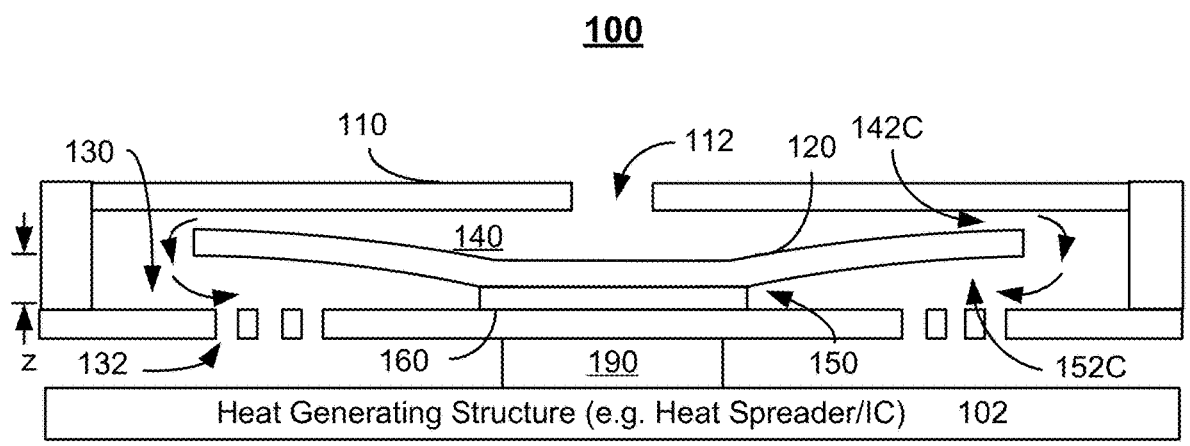
Figure 1E:
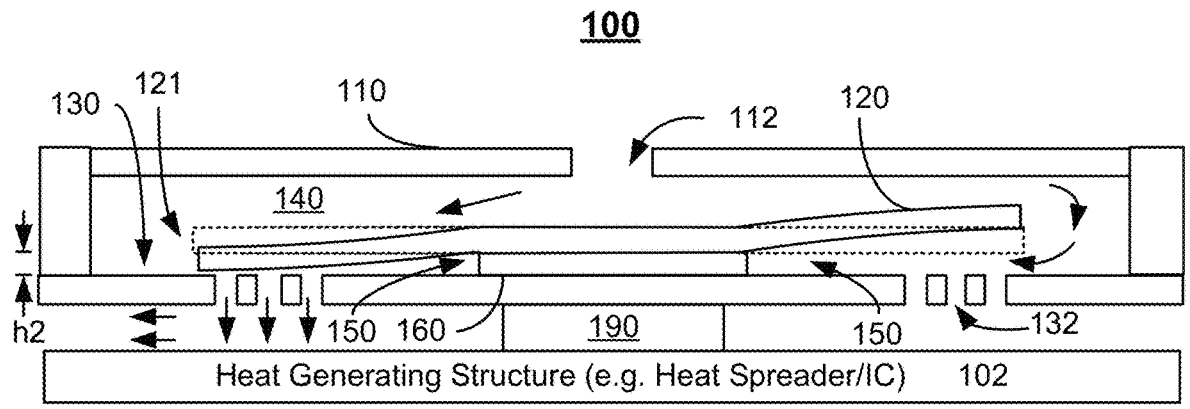
Figure 1F:
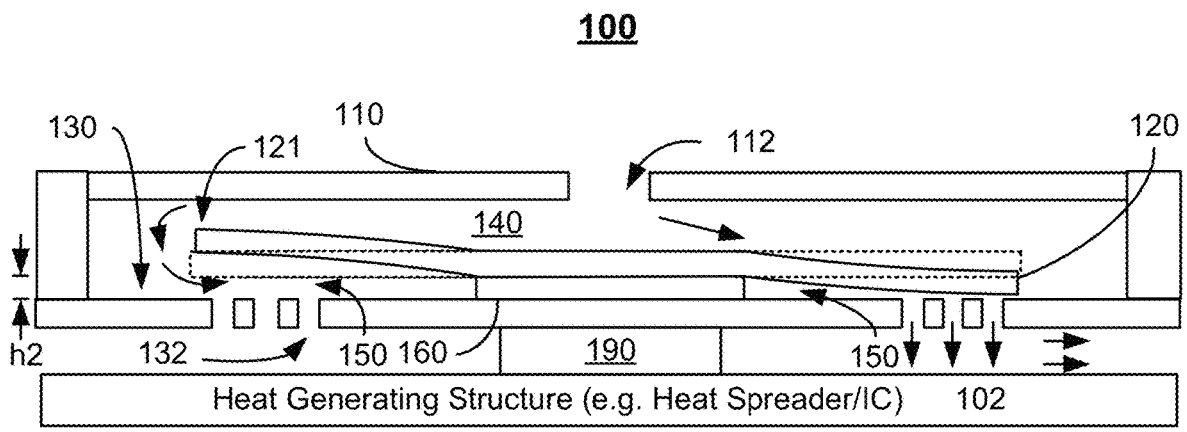
Figure 1G:
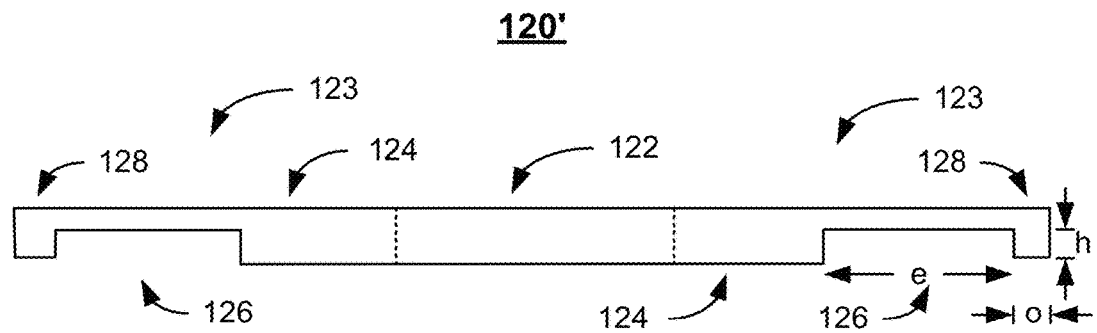

FIGS. 1A-1G are diagrams depicting an exemplary embodiment of active MEMS cooling system 100 usable with heat-generating structure 102 and including a centrally anchored cooling element 120 or 120'. Cooling element 120 is shown in FIGS. 1A-1F and cooling element 120' is shown in FIG. 1G. For clarity, only certain components are shown. FIGS. 1A-1G are not to scale. FIGS. 1A and 1B depict cross-sectional and top views of cooling system 100 in a neutral position. FIGS. 1C-1D depict cooling system 100 during actuation for in-phase vibrational motion. FIGS. 1E-1F depict cooling system 100 during actuation for out-of-phase vibrational motion. Although shown as symmetric, cooling system 100 need not be.

Cooling system 100 includes top plate 110 having vent 112 therein, cooling element 120, orifice plate 130 having orifices 132 therein, support structure (or "anchor") 160 and chambers 140 and 150 (collectively chamber 140/150) formed therein. Cooling element 120 is supported at its central region by anchor 160. Regions of cooling element 120 closer to and including portions of the cooling element's perimeter (e.g. tip 121) vibrate when actuated. In some embodiments, tip 121 of cooling element 120 includes a portion of the perimeter furthest from anchor 160 and undergoes the largest deflection during actuation of cooling element 120. For clarity, only one tip 121 of cooling element 120 is labeled in FIG. 1A. Also shown is pedestal 190 that connects orifice plate 130 to and offsets orifice plate 130 from heat-generating structure 102. In some embodiments, pedestal 190 also thermally couples orifice plate 130 to heat-generating structure 102.

FIG. 1A depicts cooling system 100 in a neutral position. Thus, cooling element 120 is shown as substantially flat. For in-phase operation, cooling element 120 is driven to vibrate between positions shown in FIGS. 1C and 1D. This vibrational motion draws fluid (e.g. air) into vent 112, through chambers 140 and 150 and out orifices 132 at high speed and/or flow rates. For example, the speed at which the fluid impinges on heat-generating structure 102 may be at least thirty meters per second. In some embodiments, the fluid is driven by cooling element 120 toward heat-generating structure 102 at a speed of at least forty-five meters per second. In some embodiments, the fluid is driven toward heat-generating structure 102 by cooling element 120 at speeds of at least sixty meters per second. Other speeds may be possible in some embodiments. Cooling system 100 is also configured so that little or no fluid is drawn back into chamber 140/150 through orifices 132 by the vibrational motion of cooling element 120.

Heat-generating structure 102 is desired to be cooled by cooling system 100. In some embodiments, heat-generating structure 102 generates heat. For example, heat-generating structure may be an integrated circuit. In some embodiments, heat-generating structure 102 is desired to be cooled but does not generate heat itself. Heat-generating structure 102 may conduct heat (e.g. from a nearby object that generates heat). For example, heat-generating structure 102 might be a heat spreader or a vapor chamber. Thus, heat-generating structure 102 may include semiconductor component(s) including individual integrated circuit components such as processors, other integrated circuit(s) and/or chip package(s); sensor(s); optical device(s); one or more batteries; other component(s) of an electronic device such as a computing device; heat spreaders; heat pipes; other electronic component(s) and/or other device(s) desired to be cooled. In some embodiments, heat-generating structure 102 may be a thermally conductive part of a module containing cooling system 100. For example, cooling system 100 may be affixed to heat-generating structure 102, which may be coupled to another heat sink, vapor chamber, integrated circuit, or other separate structure desired to be cooled.

The devices in which cooling system 100 is desired to be used may also have limited space in which to place a cooling system. For example, cooling system 100 may be used in computing devices. Such computing devices may include but are not limited to smartphones, tablet computers, laptop computers, tablets, two-in-one laptops, hand held gaming systems, digital cameras, virtual reality headsets, augmented reality headsets, mixed reality headsets and other devices that are thin. Cooling system 100 may be a micro-electro-mechanical system (MEMS) cooling system capable of residing within mobile computing devices and/or other devices having limited space in at least one dimension. For example, the total height, h3, of cooling system 100 (from the top of heat-generating structure 102 to the top of top plate 110) may be less than 2 millimeters. In some embodiments, the total height of cooling system 100 is not more than 1.5 millimeters. In some embodiments, this total height is not more than 1.1 millimeters. In some embodiments, the total height does not exceed one millimeter. In some embodiments, the total height does not exceed two hundred and fifty micrometers. Similarly, the distance between the bottom of orifice plate 130 and the top of heat-generating structure 102, y, may be small. In some embodiments, y is at least two hundred micrometers and not more than 1.2 millimeter. For example, y may be at least two hundred and fifty micrometers and not more than three hundred micrometers. In some embodiments, y is at least five hundred micrometers and not more than one millimeter. In some embodiments, y is at least two hundred micrometers and not more than three hundred micrometers. Thus, cooling system 100 is usable in computing devices and/or other devices having limited space in at least one dimension. However, nothing prevents the use of cooling system 100 in devices having fewer limitations on space and/or for purposes other than cooling. Although one cooling system 100 is shown (e.g. one cooling cell), multiple cooling systems 100 might be used in connection with heat-generating structure 102. For example, a one or two-dimensional array of cooling cells might be utilized.

Cooling system 100 is in communication with a fluid used to cool heat-generating structure 102. The fluid may be a gas or a liquid. For example, the fluid may be air. In some embodiments, the fluid includes fluid from outside of the device in which cooling system 100 resides (e.g. provided through external vents in the device). In some embodiments, the fluid circulates within the device in which cooling system resides (e.g. in an enclosed device).

Cooling element 120 can be considered to divide the interior of active MEMS cooling system 100 into top chamber 140 and bottom chamber 150. Top chamber 140 is formed by cooling element 120, the sides, and top plate 110. Bottom chamber 150 is formed by orifice plate 130, the sides, cooling element 120 and anchor 160. Top chamber 140 and bottom chamber 150 are connected at the periphery of cooling element 120 and together form chamber 140/150 (e.g. an interior chamber of cooling system 100).

The size and configuration of top chamber 140 may be a function of the cell (cooling system 100) dimensions, cooling element 120 motion, and the frequency of operation. Top chamber 140 has a height, h1. The height of top chamber 140 may be selected to provide sufficient pressure to drive the fluid to bottom chamber 150 and through orifices 132 at the desired flow rate and/or speed. Top chamber 140 is also sufficiently tall that cooling element 120 does not contact top plate 110 when actuated. In some embodiments, the height of top chamber 140 is at least fifty micrometers and not more than five hundred micrometers. In some embodiments, top chamber 140 has a height of at least two hundred and not more than three hundred micrometers.

Bottom chamber 150 has a height, h2. In some embodiments, the height of bottom chamber 150 is sufficient to accommodate the motion of cooling element 120. Thus, no portion of cooling element 120 contacts orifice plate 130 during normal operation. Bottom chamber 150 is generally smaller than top chamber 140 and may aid in reducing the backflow of fluid into orifices 132. In some embodiments, the height of bottom chamber 150 is the maximum deflection of cooling element 120 plus at least five micrometers and not more than ten micrometers. In some embodiments, the deflection of cooling element 120 (e.g. the deflection of tip 121), z, has an amplitude of at least ten micrometers and not more than one hundred micrometers. In some such embodiments, the amplitude of deflection of cooling element 120 is at least ten micrometers and not more than sixty micrometers. However, the amplitude of deflection of cooling element 120 depends on factors such as the desired flow rate through cooling system 100 and the configuration of cooling system 100. Thus, the height of bottom chamber 150 generally depends on the flow rate through and other components of cooling system 100.

Top plate 110 includes vent 112 through which fluid may be drawn into cooling system 100. Top vent 112 may have a size chosen based on the desired acoustic pressure in chamber 140. For example, in some embodiments, the width, w, of vent 112 is at least five hundred micrometers and not more than one thousand micrometers. In some embodiments, the width of vent 112 is at least two hundred fifty micrometers and not more than two thousand micrometers. In the embodiment shown, vent 112 is a centrally located aperture in top plate 110. In other embodiments, vent 112 may be located elsewhere. For example, vent 112 may be closer to one of the edges of top plate 110. Vent 112 may have a circular, rectangular or other shaped footprint. Although a single vent 112 is shown, multiple vents might be used. For example, vents may be offset toward the edges of top chamber 140 or be located on the side(s) of top chamber 140. Although top plate 110 is shown as substantially flat, in some embodiments trenches and/or other structures may be provided in top plate 110 to modify the configuration of top chamber 140 and/or the region above top plate 110.

Anchor (support structure) 160 supports cooling element 120 at the central portion of cooling element 120. Thus, at least part of the perimeter of cooling element 120 is unpinned and free to vibrate. In some embodiments, anchor 160 extends along a central axis of cooling element 120 (e.g. perpendicular to the page in FIGS. 1A-1F). In such embodiments, portions of cooling element 120 that vibrate (e.g. including tip 121) move in a cantilevered fashion. Thus, portions of cooling element 120 may move in a manner analogous to the wings of a butterfly (i.e. in phase) and/or analogous to a seesaw (i.e. out of phase). Thus, the portions of cooling element 120 that vibrate in a cantilevered fashion do so in phase in some embodiments and out of phase in other embodiments. In some embodiments, anchor 160 does not extend along an axis of cooling element 120. In such embodiments, all portions of the perimeter of cooling element 120 are free to vibrate (e.g. analogous to a jellyfish). In the embodiment shown, anchor 160 supports cooling element 120 from the bottom of cooling element 120. In other embodiments, anchor 160 may support cooling element 120 in another manner. For example, anchor 160 may support cooling element 120 from the top (e.g. cooling element 120 hangs from anchor 160). In some embodiments, the width, a, of anchor 160 is at least 0.5 millimeters and not more than four millimeters. In some embodiments, the width of anchor 160 is at least two millimeters and not more than 2.5 millimeters. Anchor 160 may occupy at least ten percent and not more than fifty percent of cooling element 120.

Cooling element 120 has a first side distal from heat-generating structure 102 and a second side proximate to heat-generating structure 102. In the embodiment shown in FIGS. 1A-1F, the first side of cooling element 120 is the top of cooling element 120 (closer to top plate 110) and the second side is the bottom of cooling element 120 (closer to orifice plate 130). Cooling element 120 is actuated to undergo vibrational motion as shown in FIGS. 1A-1F. The vibrational motion of cooling element 120 drives fluid from the first side of cooling element 120 distal from heat-generating structure 102 (e.g. from top chamber 140) to a second side of cooling element 120 proximate to heat-generating structure 102 (e.g. to bottom chamber 150). The vibrational motion of cooling element 120 also draws fluid through vent 112 and into top chamber 140; forces fluid from top chamber 140 to bottom chamber 150; and drives fluid from bottom chamber 150 through orifices 132 of orifice plate 130. Thus, cooling element 120 may be viewed as an actuator. Although described in the context of a single, continuous cooling element, in some embodiments, cooling element 120 may be formed by two (or more) cooling elements. Each of the cooling elements as one portion pinned (e.g. supported by support structure 160) and an opposite portion unpinned. Thus, a single, centrally supported cooling element 120 may be formed by a combination of multiple cooling elements supported at an edge.

Cooling element 120 has a length, L, that depends upon the frequency at which cooling element 120 is desired to vibrate. In some embodiments, the length of cooling element 120 is at least four millimeters and not more than ten millimeters. In some such embodiments, cooling element 120 has a length of at least six millimeters and not more than eight millimeters. The depth of cooling element 120 (e.g. perpendicular to the plane shown in FIGS. 1A-1F) may vary from one fourth of L through twice L. For example, cooling element 120 may have the same depth as length. The thickness, t, of cooling element 120 may vary based upon the configuration of cooling element 120 and/or the frequency at which cooling element 120 is desired to be actuated. In some embodiments, the cooling element thickness is at least two hundred micrometers and not more than three hundred and fifty micrometers for cooling element 120 having a length of eight millimeters and driven at a frequency of at least twenty kilohertz and not more than twenty-five kilohertz. The length, C of chamber 140/150 is close to the length, L, of cooling element 120. For example, in some embodiments, the distance, d, between the edge of cooling element 120 and the wall of chamber 140/150 is at least one hundred micrometers and not more than five hundred micrometers. In some embodiments, d is at least two hundred micrometers and not more than three hundred micrometers.

Cooling element 120 may be driven at a frequency that is at or near both the resonant frequency for an acoustic resonance of a pressure wave of the fluid in top chamber 140 and the resonant frequency for a structural resonance of cooling element 120. The portion of cooling element 120 undergoing vibrational motion is driven at or near resonance (the "structural resonance") of cooling element 120. This portion of cooling element 120 undergoing vibration may be a cantilevered section in some embodiments. The frequency of vibration for structural resonance is termed the structural resonant frequency. Use of the structural resonant frequency in driving cooling element 120 reduces the power consumption of cooling system 100. Cooling element 120 and top chamber 140 may also be configured such that this structural resonant frequency corresponds to a resonance in a pressure wave in the fluid being driven through top chamber 140 (the acoustic resonance of top chamber 140). The frequency of such a pressure wave is termed the acoustic resonant frequency. At acoustic resonance, a node in pressure occurs near vent 112 and an antinode in pressure occurs near the periphery of cooling system 100 (e.g. near tip 121 of cooling element 120 and near the connection between top chamber 140 and bottom chamber 150). The distance between these two regions is C/2. Thus, $C/2=n\lambda/4$, where $\lambda$ is the acoustic wavelength for the fluid and n is odd (e.g. n=1, 3, 5, etc.). For the lowest order mode, $C=\lambda/2$. Because the length of chamber 140 (e.g. C) is close to the length of cooling element 120, in some embodiments, it is also approximately true that $L/2=n\lambda/4$, where $\lambda$ is the acoustic wavelength for the fluid and n is odd. Thus, the frequency at which cooling element 120 is driven, v, is at or near the structural resonant frequency for cooling element 120. The frequency v is also at or near the acoustic resonant frequency for at least top chamber 140. The acoustic resonant frequency of top chamber 140 generally varies less dramatically with parameters such as temperature and size than the structural resonant frequency of cooling element 120. Consequently, in some embodiments, cooling element 120 may be driven at (or closer to) a structural resonant frequency than to the acoustic resonant frequency.

Orifice plate 130 has orifices 132 therein. Although a particular number and distribution of orifices 132 are shown, another number and/or another distribution may be used. A single orifice plate 130 is used for a single cooling system 100. In other embodiments, multiple cooling systems 100 may share an orifice plate. For example, multiple cells 100 may be provided together in a desired configuration. In such embodiments, the cells 100 may be the same size and configuration or different size(s) and/or configuration(s). Orifices 132 are shown as having an axis oriented normal to a surface of heat-generating structure 102. In other embodiments, the axis of one or more orifices 132 may be at another angle. For example, the angle of the axis may be selected from substantially zero degrees and a nonzero acute angle. Orifices 132 also have sidewalls that are substantially parallel to the normal to the surface of orifice plate 130. In some embodiments, orifices may have sidewalls at a nonzero angle to the normal to the surface of orifice plate 130. For example, orifices 132 may be cone-shaped. Further, although orifice place 130 is shown as substantially flat, in some embodiments, trenches and/or other structures may be provided in orifice plate 130 to modify the configuration of bottom chamber 150 and/or the region between orifice plate 130 and heat-generating structure 102.

The size, distribution and locations of orifices 132 are chosen to control the flow rate of fluid driven to the surface of heat-generating structure 102. The locations and configurations of orifices 132 may be configured to increase/maximize the fluid flow from bottom chamber 150 through orifices 132 to the jet channel (the region between the bottom of orifice plate 130 and the top of heat-generating structure 102). The locations and configurations of orifices 132 may also be selected to reduce/minimize the suction flow (e.g. back flow) from the jet channel through orifices 132. For example, the locations of orifices are desired to be sufficiently far from tip 121 that suction in the upstroke of cooling element 120 (tip 121 moves away from orifice plate 13) that would pull fluid into bottom chamber 150 through orifices 132 is reduced. The locations of orifices are also desired to be sufficiently close to tip 121 that suction in the upstroke of cooling element 120 also allows a higher pressure from top chamber 140 to push fluid from top chamber 140 into bottom chamber 150. In some embodiments, the ratio of the flow rate from top chamber 140 into bottom chamber 150 to the flow rate from the jet channel through orifices 132 in the upstroke (the "net flow ratio") is greater than 2:1. In some embodiments, the net flow ratio is at least 85:15. In some embodiments, the net flow ratio is at least 90:10. In order to provide the desired pressure, flow rate, suction, and net flow ratio, orifices 132 are desired to be at least a distance, r1, from tip 121 and not more than a distance, r2, from tip 121 of cooling element 120. In some embodiments r1 is at least one hundred micrometers (e.g. r1≥100 μm) and r2 is not more than one millimeter (e.g. r2≤1000 μm). In some embodiments, orifices 132 are at least two hundred micrometers from tip 121 of cooling element 120 (e.g. r1≥200 μm). In some such embodiments, orifices 132 are at least three hundred micrometers from tip 121 of cooling element 120 (e.g. r1≥300 μm). In some embodiments, orifices 132 have a width, o, of at least one hundred micrometers and not more than five hundred micrometers. In some embodiments, orifices 132 have a width of at least two hundred micrometers and not more than three hundred micrometers. In some embodiments, the orifice separation, s, is at least one hundred micrometers and not more than one millimeter. In some such embodiments, the orifice separation is at least four hundred micrometers and not more than six hundred micrometers. In some embodiments, orifices 132 are also desired to occupy a particular fraction of the area of orifice plate 130. For example, orifices 132 may cover at least five percent and not more than fifteen percent of the footprint of orifice plate 130 in order to achieve a desired flow rate of fluid through orifices 132. In some embodiments, orifices 132 cover at least eight percent and not more than twelve percent of the footprint of orifice plate 130.

In some embodiments, cooling element 120 is actuated using a piezoelectric. Thus, cooling element 120 may be a piezoelectric cooling element. Cooling element 120 may be driven by a piezoelectric that is mounted on or integrated into cooling element 120. In some embodiments, cooling element 120 is driven in another manner including but not limited to providing a piezoelectric on another structure in cooling system 100. Cooling element 120 and analogous cooling elements are referred to hereinafter as piezoelectric cooling element though it is possible that a mechanism other than a piezoelectric might be used to drive the cooling element. In some embodiments, cooling element 120 includes a piezoelectric layer on substrate. The substrate may include or consist of stainless steel, a Ni alloy, Hastelloy, Al (e.g. an Al alloy), and/or Ti (e.g. a Ti alloy such as Ti6Al-4V). For example, in some embodiments, the substrate may include or consist of grade 2 Ti. Orifice plate 130 may be formed of the same material as the substrate. For example, orifice plate 130 may include or consist of grade 2 Ti. Top plate 110 and surrounding structures such as the frame and structures 306 and 396 depicted in FIGS. 3A-3G may be formed of a stainless steel such as SUS430. SUS430 or an analogous material may be selected to better match the coefficient of thermal expansion of the substrate and/or orifice plate 120. In some embodiments, orifice plate 130 is diffusion bonded to the substrate and/or anchor 160. In some embodiments, piezoelectric layer includes multiple sublayers formed as thin films on the substrate. In other embodiments, the piezoelectric layer may be a bulk layer affixed to the substrate. Such a piezoelectric cooling element 120 also includes electrodes used to activate the piezoelectric. The substrate functions as an electrode in some embodiments. In other embodiments, a bottom electrode may be provided between the substrate and the piezoelectric layer. Other layers including but not limited to seed, capping, passivation or other layers might be included in piezoelectric cooling element. Thus, cooling element 120 may be actuated using a piezoelectric.

In some embodiments, cooling system 100 includes chimneys (not shown) or other ducting. Such ducting provides a path for heated fluid to flow away from heat-generating structure 102. In some embodiments, ducting returns fluid to the side of top plate 110 distal from heat-generating structure 102. In some embodiments, ducting may instead direct fluid away from heat-generating structure 102 in a direction parallel to heat-generating structure 102 or perpendicular to heat-generating structure 102 but in the opposite direction (e.g. toward the bottom of the page). For a device in which fluid external to the device is used in cooling system 100, the ducting may channel the heated fluid to a vent. In such embodiments, additional fluid may be provided from an inlet vent. In embodiments, in which the device is enclosed, the ducting may provide a circuitous path back to the region near vent 112 and distal from heat-generating structure 102. Such a path allows for the fluid to dissipate heat before being reused to cool heat-generating structure 102. In other embodiments, ducting may be omitted or configured in another manner. Thus, the fluid is allowed to carry away heat from heat-generating structure 102.

Operation of cooling system 100 is described in the context of FIGS. 1A-1F. Although described in the context of particular pressures, gap sizes, and timing of flow, operation of cooling system 100 is not dependent upon the explanation herein. FIGS. 1C-1D depict in-phase operation of cooling system 100. Referring to FIG. 1C, cooling element 120 has been actuated so that its tip 121 moves away from top plate 110. FIG. 1C can thus be considered to depict the end of a down stroke of cooling element 120. Because of the vibrational motion of cooling element 120, gap 152 for bottom chamber 150 has decreased in size and is shown as gap 152B. Conversely, gap 142 for top chamber 140 has increased in size and is shown as gap 142B. During the down stroke, a lower (e.g. minimum) pressure is developed at the periphery when cooling element 120 is at the neutral position. As the down stroke continues, bottom chamber 150 decreases in size and top chamber 140 increases in size as shown in FIG. 1C. Thus, fluid is driven out of orifices 132 in a direction that is at or near perpendicular to the surface of orifice plate 130 and/or the top surface of heat-generating structure 102. The fluid is driven from orifices 132 toward heat-generating structure 102 at a high speed, for example in excess of thirty-five meters per second. In some embodiments, the fluid then travels along the surface of heat-generating structure 102 and toward the periphery of heat-generating structure 102, where the pressure is lower than near orifices 132. Also in the down stroke, top chamber 140 increases in size and a lower pressure is present in top chamber 140. As a result, fluid is drawn into top chamber 140 through vent 112. The motion of the fluid into vent 112, through orifices 132, and along the surface of heat-generating structure 102 is shown by unlabeled arrows in FIG. 1C.

Cooling element 120 is also actuated so that tip 121 moves away from heat-generating structure 102 and toward top plate 110. FIG. 1D can thus be considered to depict the end of an up stroke of cooling element 120. Because of the motion of cooling element 120, gap 142 has decreased in size and is shown as gap 142C. Gap 152 has increased in size and is shown as gap 152C. During the upstroke, a higher (e.g. maximum) pressure is developed at the periphery when cooling element 120 is at the neutral position. As the upstroke continues, bottom chamber 150 increases in size and top chamber 140 decreases in size as shown in FIG. 1D. Thus, the fluid is driven from top chamber 140 (e.g. the periphery of chamber 140/150) to bottom chamber 150. Thus, when tip 121 of cooling element 120 moves up, top chamber 140 serves as a nozzle for the entering fluid to speed up and be driven towards bottom chamber 150. The motion of the fluid into bottom chamber 150 is shown by unlabeled arrows in FIG. 1D. The location and configuration of cooling element 120 and orifices 132 are selected to reduce suction and, therefore, back flow of fluid from the jet channel (between heat-generating structure 102 and orifice plate 130) into orifices 132 during the upstroke. Thus, cooling system 100 is able to drive fluid from top chamber 140 to bottom chamber 150 without an undue amount of backflow of heated fluid from the jet channel entering bottom chamber 140. Moreover, cooling system 100 may operate such that fluid is drawn in through vent 112 and driven out through orifices 132 without cooling element 120 contacting top plate 110 or orifice plate 130. Thus, pressures are developed within chambers 140 and 150 that effectively open and close vent 112 and orifices 132 such that fluid is driven through cooling system 100 as described herein.

The motion between the positions shown in FIGS. 1C and 1D is repeated. Thus, cooling element 120 undergoes vibrational motion indicated in FIGS. 1A, 1B, and 1D, drawing fluid through vent 112 from the distal side of top plate 110 into top chamber 140; transferring fluid from top chamber 140 to bottom chamber 150; and pushing the fluid through orifices 132 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at frequencies from 15 kHz through 30 kHz. In some embodiments, cooling element 120 vibrates at a frequency/frequencies of at least 20 kHz and not more than 30 kHz (e.g. 23 kHz-25 kHz). The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 may move substantially normal (perpendicular) to the top surface of heat-generating structure 102. In some embodiments, the fluid motion may have a nonzero acute angle with respect to the normal to the top surface of heat-generating structure 102. In either case, the fluid may thin and/or form apertures in the boundary layer of fluid at heat-generating structure 102. As a result, transfer of heat from heat-generating structure 102 may be improved. The fluid deflects off of heat-generating structure 102, traveling along the surface of heat-generating structure 102. In some embodiments, the fluid moves in a direction substantially parallel to the top of heat-generating structure 102. Thus, heat from heat-generating structure 102 may be extracted by the fluid. The fluid may exit the region between orifice plate 130 and heat-generating structure 102 at the edges of cooling system 100. Chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of cooling element 120. As a result, heat-generating structure 102 may be cooled.

FIGS. 1E-1F depict an embodiment of active MEMS cooling system 100 including centrally anchored cooling element 120 in which the cooling element is driven out-of-phase. More specifically, sections of cooling element 120 on opposite sides of anchor 160 (and thus on opposite sides of the central region of cooling element 120 that is supported by anchor 160) are driven to vibrate out-of-phase. In some embodiments, sections of cooling element 120 on opposite sides of anchor 160 are driven at or near one hundred and eighty degrees out-of-phase. Thus, one section of cooling element 120 vibrates toward top plate 110, while the other section of cooling element 120 vibrates toward orifice plate 130/heat-generating structure 102. Movement of a section of cooling element 120 toward top plate 110 (an upstroke) drives fluid in top chamber 140 to bottom chamber 150 on that side of anchor 160. Movement of a section of cooling element 120 toward orifice plate 130 drives fluid through orifices 132 and toward heat-generating structure 102. Thus, fluid traveling at high speeds (e.g. speeds described with respect to in-phase operation) is alternately driven out of orifices 132 on opposing sides of anchor 160. Because fluid is driven through orifices 132 at high speeds, cooling system 100 may be viewed as a MEMs jet. The movement of fluid is shown by unlabeled arrows in FIGS. 1E and 1F. The motion between the positions shown in FIGS. 1E and 1F is repeated. Thus, cooling element 120 undergoes vibrational motion indicated in FIGS. 1A, 1E, and 1F, alternately drawing fluid through vent 112 from the distal side of top plate 110 into top chamber 140 for each side of cooling element 120; transferring fluid from each side of top chamber 140 to the corresponding side of bottom chamber 150; and pushing the fluid through orifices 132 on each side of anchor 160 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at the frequencies described for in-phase vibration. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 for out-of-phase vibration may move substantially normal (perpendicular) to the top surface of heat-generating structure 102, in a manner analogous to that described above for in-phase operation. Similarly, chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of cooling element 120. As a result, heat-generating structure 102 may be cooled.

Although shown in the context of a uniform cooling element in FIGS. 1A-1F, cooling system 100 may utilize cooling elements having different shapes. FIG. 1G depicts an embodiment of engineered cooling element 120' having a tailored geometry and usable in a cooling system such as cooling system 100. Cooling element 120' includes an anchored region 122 and cantilevered arms 123. Anchored region 122 is supported (e.g. held in place) in cooling system 100 by anchor 160. Cantilevered arms 123 undergo vibrational motion in response to cooling element 120' being actuated. Each cantilevered arm 123 includes step region 124, extension region 126 and outer region 128. In the embodiment shown in FIG. 1G, anchored region 122 is centrally located. Step region 124 extends outward from anchored region 122. Extension region 126 extends outward from step region 124. Outer region 128 extends outward from extension region 126. In other embodiments, anchored region 122 may be at one edge of the actuator and outer region 128 at the opposing edge. In such embodiments, the actuator is edge anchored.

Extension region 126 has a thickness (extension thickness) that is less than the thickness of step region 124 (step thickness) and less than the thickness of outer region 128 (outer thickness). Thus, extension region 126 may be viewed as recessed. Extension region 126 may also be seen as providing a larger bottom chamber 150. In some embodiments, the outer thickness of outer region 128 is the same as the step thickness of step region 124. In some embodiments, the outer thickness of outer region 128 is different from the step thickness of step region 124. In some embodiments, outer region 128 and step region 124 each have a thickness of at least three hundred twenty micrometers and not more than three hundred and sixty micrometers. In some embodiments, the outer thickness is at least fifty micrometers and not more than two hundred micrometers thicker than the extension thickness. Stated differently, the step (difference in step thickness and extension thickness) is at least fifty micrometers and not more than two hundred micrometers. In some embodiments, the outer step (difference in outer thickness and extension thickness) is at least fifty micrometers and not more than two hundred micrometers. Outer region 128 may have a width, o, of at least one hundred micrometers and not more than three hundred micrometers. Extension region has a length, e, extending outward from the step region of at least 0.5 millimeter and not more than 1.5 millimeters in some embodiments. In some embodiments, outer region 128 has a higher mass per unit length in the direction from anchored region 122 than extension region 126. This difference in mass may be due to the larger size of outer region 128, a difference in density between portions of cooling element 120, and/or another mechanism.

Use of engineered cooling element 120' may further improve efficiency of cooling system 100. Extension region 126 is thinner than step region 124 and outer region 128. This results in a cavity in the bottom of cooling element 120' corresponding to extension region 126. The presence of this cavity aids in improving the efficiency of cooling system 100. Each cantilevered arm 123 vibrates towards top plate 110 in an upstroke and away from top plate 110 in a downstroke. When a cantilevered arm 123 moves toward top plate 110, higher pressure fluid in top chamber 140 resists the motion of cantilevered arm 123. Furthermore, suction in bottom chamber 150 also resists the upward motion of cantilevered arm 123 during the upstroke. In the downstroke of cantilevered arm 123, increased pressure in the bottom chamber 150 and suction in top chamber 140 resist the downward motion of cantilevered arm 123. However, the presence of the cavity in cantilevered arm 123 corresponding to extension region 126 mitigates the suction in bottom chamber 150 during an upstroke. The cavity also reduces the increase in pressure in bottom chamber 150 during a downstroke. Because the suction and pressure increase are reduced in magnitude, cantilevered arms 123 may more readily move through the fluid. This may be achieved while substantially maintaining a higher pressure in top chamber 140, which drives the fluid flow through cooling system 100. Moreover, the presence of outer region 128 may improve the ability of cantilevered arm 123 to move through the fluid being driven through cooling system 100. Outer region 128 has a higher mass per unit length and thus a higher momentum. Consequently, outer region 128 may improve the ability of cantilevered arms 123 to move through the fluid being driven through cooling system 100. The magnitude of the deflection of cantilevered arm 123 may also be increased. These benefits may be achieved while maintaining the stiffness of cantilevered arms 123 through the use of thicker step region 124. Further, the larger thickness of outer region 128 may aid in pinching off flow at the bottom of a downstroke. Thus, the ability of cooling element 120' to provide a valve preventing backflow through orifices 132 may be improved. Thus, performance of cooling system 100 employing cooling element 120' may be improved.

Using the cooling system 100 actuated for in-phase vibration or out-of-phase vibration of cooling element 120 and/or 120', fluid drawn in through vent 112 and driven through orifices 132 may efficiently dissipate heat from heat-generating structure 102. Because fluid impinges upon the heat-generating structure with sufficient speed (e.g. at least thirty meters per second) and in some embodiments substantially normal to the heat-generating structure, the boundary layer of fluid at the heat-generating structure may be thinned and/or partially removed. Consequently, heat transfer between heat-generating structure 102 and the moving fluid is improved. Because the heat-generating structure is more efficiently cooled, the corresponding integrated circuit may be run at higher speed and/or power for longer times. For example, if the heat-generating structure corresponds to a high-speed processor, such a processor may be run for longer times before throttling. Thus, performance of a device utilizing cooling system 100 may be improved. Further, cooling system 100 may be a MEMS device. Consequently, cooling systems 100 may be suitable for use in smaller and/or mobile devices, such as smart phones, other mobile phones, virtual reality headsets, tablets, two-in-one computers, wearables and handheld games, in which limited space is available. Performance of such devices may thus be improved. Because cooling element 120/120' may be vibrated at frequencies of 15 kHz or more, users may not hear any noise associated with actuation of cooling elements. If driven at or near structural and/or acoustic resonant frequencies, the power used in operating cooling systems may be significantly reduced. Cooling element 120/120' does not physically contact top plate 110 or orifice plate 130 during vibration. Thus, resonance of cooling element 120/120' may be more readily maintained. More specifically, physical contact between cooling element 120/120' and other structures disturbs the resonance conditions for cooling element 120/120'. Disturbing these conditions may drive cooling element 120/120' out of resonance. Thus, additional power would need to be used to maintain actuation of cooling element 120/120'. Further, the flow of fluid driven by cooling element 120/120' may decrease. These issues are avoided through the use of pressure differentials and fluid flow as discussed above. The benefits of improved, quiet cooling may be achieved with limited additional power. Further, out-of-phase vibration of cooling element 120/120' allows the position of the center of mass of cooling element 100 to remain more stable. Although a torque is exerted on cooling element 120/120', the force due to the motion of the center of mass is reduced or eliminated. As a result, vibrations due to the motion of cooling element 120/120' may be reduced. Moreover, efficiency of cooling system 100 may be improved through the use of out-of-phase vibrational motion for the two sides of cooling element 120/120'. Consequently, performance of devices incorporating the cooling system 100 may be improved. Further, cooling system 100 may be usable in other applications (e.g. with or without heat-generating structure 102) in which high fluid flows and/or velocities are desired.

Further, cooling elements used in cooling system 100 may have different structures and/or be mounted differently than depicted in FIGS. 1A-1G. In some embodiments, the cooling element may have rounded corners and/or rounded ends but still be anchored along a central axis such that cantilevered arms vibrate. The cooling element may be anchored only at its central region such that the regions surrounding the anchor vibrate in a manner analogous to a jellyfish or the opening/closing of an umbrella. In some such embodiments, the cooling element may be circular or elliptical in shape. In some embodiments, the anchor may include apertures through which fluid may flow. Such an anchor may be utilized for the cooling element being anchored at its top (e.g. to the top plate). Although not indicated in FIGS. 1A-1G, the piezoelectric utilized in driving the cooling element may have various locations and/or configurations. For example, the piezoelectric may be embedded in the cooling element, affixed to one side of the cooling element (or cantilevered arm(s)), may occupy some or all of the cantilevered arms, and/or may have a location that is close to or distal from the anchored region. In some embodiments, cooling elements that are not centrally anchored may be used. For example, a pair of cooling elements that have offset apertures, that are anchored at their ends (or all edges), and which vibrate out of phase may be used. Thus, various additional configurations of cooling element 120 and/or 120', anchor 160, and/or other portions of cooling system 100 may be used.

Figure 2A:
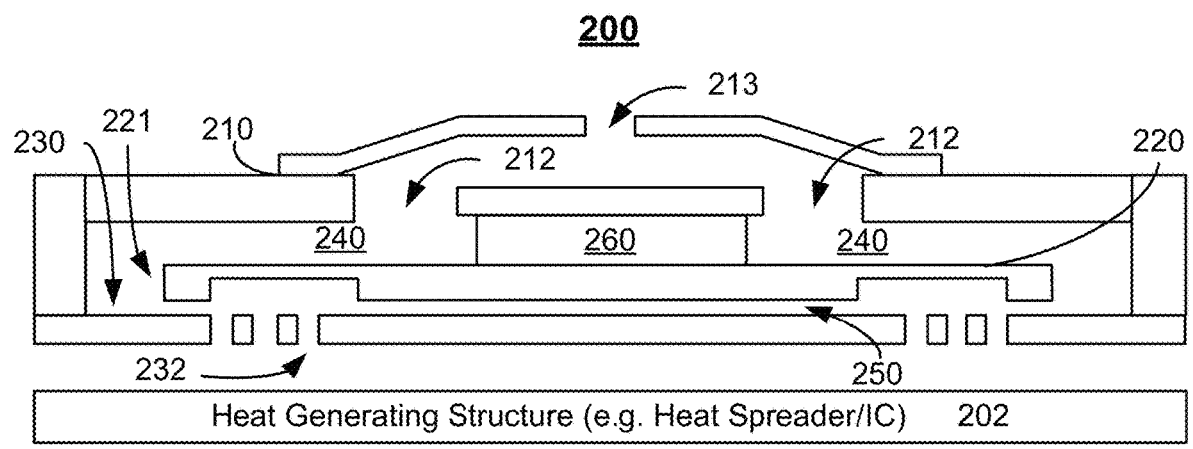
FIGS. 2A-2B depict an embodiment of an active MEMS cooling system including a centrally anchored cooling element.
Figure 2B:
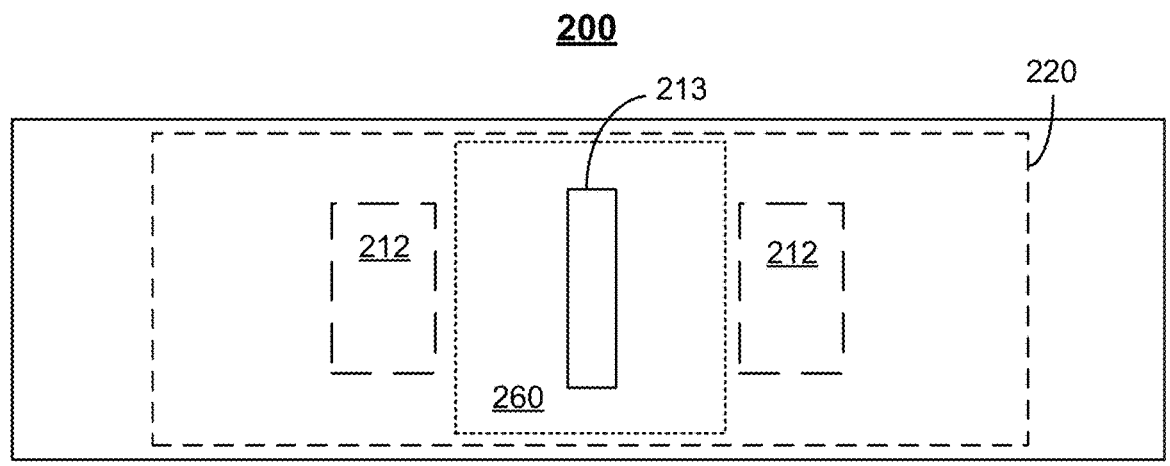

FIGS. 2A-2B depict plan an embodiment of active MEMS cooling system 200 including a top centrally anchored cooling element. FIG. 2A depicts a side view of cooling system 200 in a neutral position. FIG. 2B depicts a top view of cooling system 200. FIGS. 2A-2B are not to scale. For simplicity, only portions of cooling system 200 are shown. Referring to FIGS. 2A-2B, cooling system 200 is analogous to cooling system 100. Consequently, analogous components have similar labels. For example, cooling system 200 is used in conjunction with heat-generating structure 202, which is analogous to heat-generating structure 202.

Cooling system 200 includes top plate 210 having vents 212, cooling element 220 having tip 221, orifice plate 230 including orifices 232, top chamber 240 having a gap, bottom chamber 250 having a gap, flow chamber 240/250, and anchor (i.e. support structure) 260 that are analogous to top plate 110 having vent 112, cooling element 120 having tip 121, orifice plate 130 including orifices 132, top chamber 140 having gap 142, bottom chamber 150 having gap 152, flow chamber 140/150, and anchor (i.e. support structure) 160, respectively. Also shown is pedestal 290 that is analogous to pedestal 190. Thus, cooling element 220 is centrally supported by anchor 260 such that at least a portion of the perimeter of cooling element 220 is free to vibrate. In some embodiments, anchor 260 extends along the axis of cooling element 220. In other embodiments, anchor 260 is only near the center portion of cooling element 220. Although not explicitly labeled in FIGS. 2A and 2B, cooling element 220 includes an anchored region and cantilevered arms including step region, extension region and outer regions analogous to anchored region 122, cantilevered arms 123, step region 124, extension region 126 and outer region 128 of cooling element 120'. In some embodiments, cantilevered arms of cooling element 220 are driven in-phase. In some embodiments, cantilevered arms of cooling element 220 are driven out-of-phase. In some embodiments, a simple cooling element, such as cooling element 120, may be used.

Anchor 260 supports cooling element 220 from above. Thus, cooling element 220 is suspended from anchor 260. Anchor 260 is suspended from top plate 210. Top plate 210 includes vent 213. Vents 212 on the sides of anchor 260 provide a path for fluid to flow into sides of chamber 240.

As discussed above with respect to cooling system 100, cooling element 220 may be driven to vibrate at or near the structural resonant frequency of cooling element 220. Further, the structural resonant frequency of cooling element 220 may be configured to align with the acoustic resonance of the chamber 240/250. The structural and acoustic resonant frequencies are generally chosen to be in the ultrasonic range. For example, the vibrational motion of cooling element 220 may be at the frequencies described with respect to cooling system 100. Consequently, efficiency and flow rate may be enhanced. However, other frequencies may be used.

Cooling system 200 operates in an analogous manner to cooling system 100. Cooling system 200 thus shares the benefits of cooling system 100. Thus, performance of a device employing cooling system 200 may be improved. In addition, suspending cooling element 220 from anchor 260 may further enhance performance. In particular, vibrations in cooling system 200 that may affect other cooling cells (not shown), may be reduced. For example, less vibration may be induced in top plate 210 due to the motion of cooling element 220. Consequently, cross talk between cooling system 200 and other cooling systems (e.g. other cells) or other portions of the device incorporating cooling system 200 may be reduced. Thus, performance may be further enhanced.

Figure 3A:
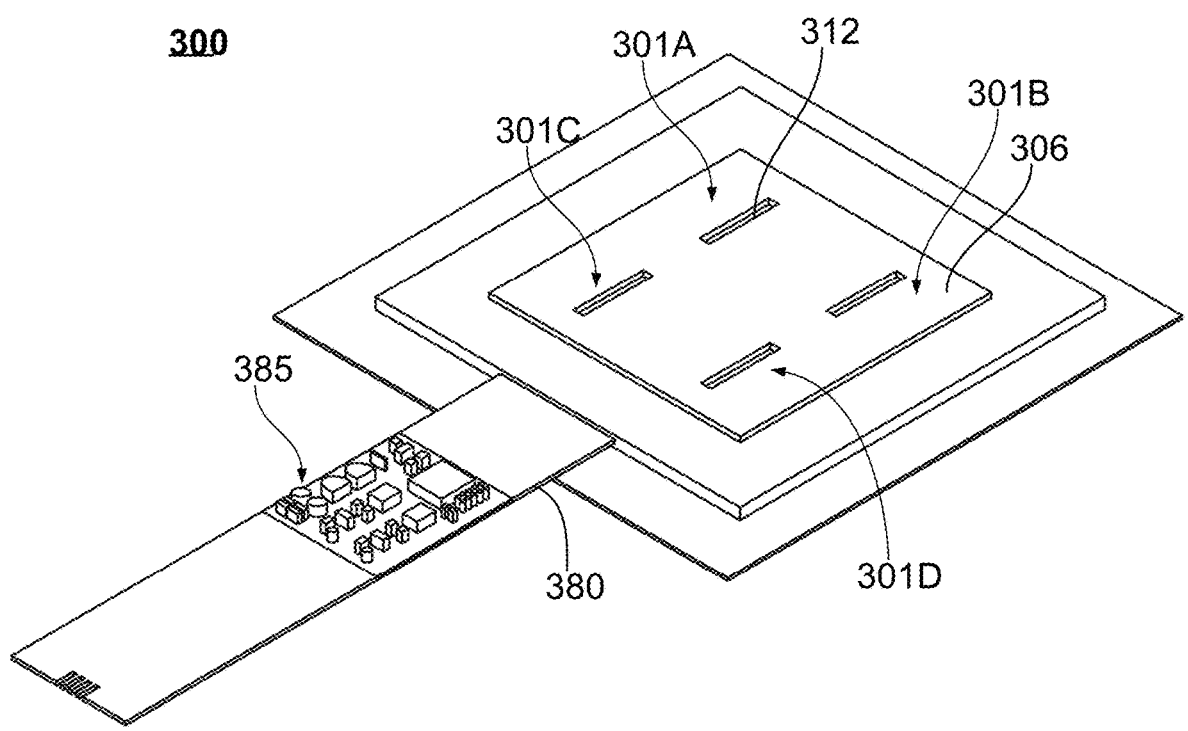
FIGS. 3A-3F depict an embodiment of an active MEMS cooling system formed in a tile.
Figure 3B:
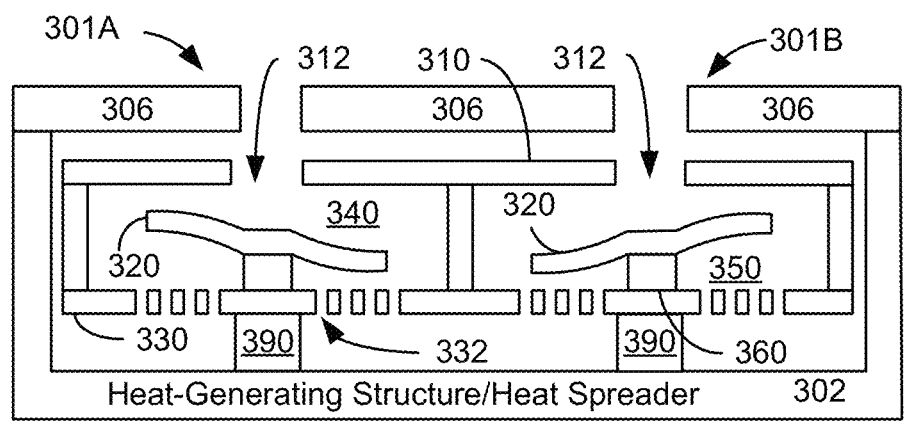
Figure 3C:
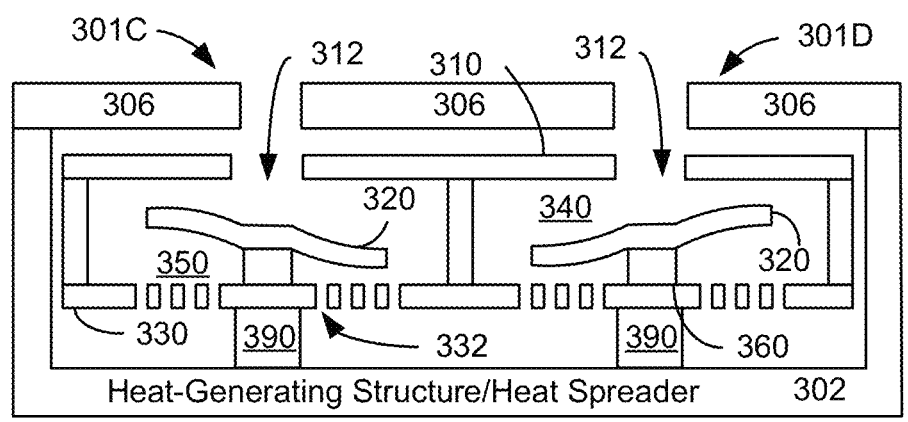
Figure 3D:
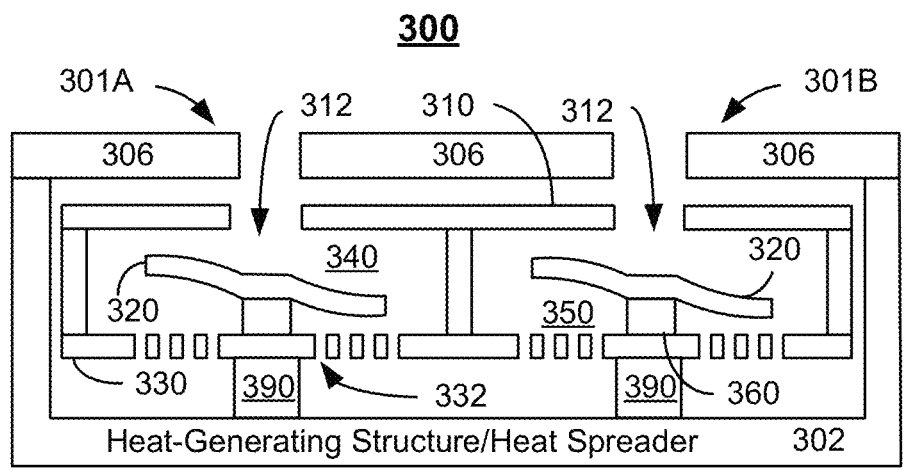
Figure 3E:
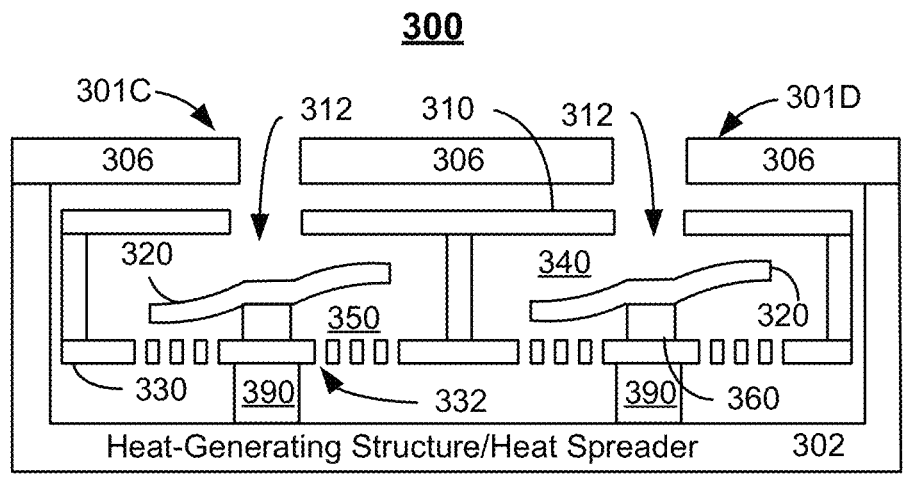
Figure 3F:
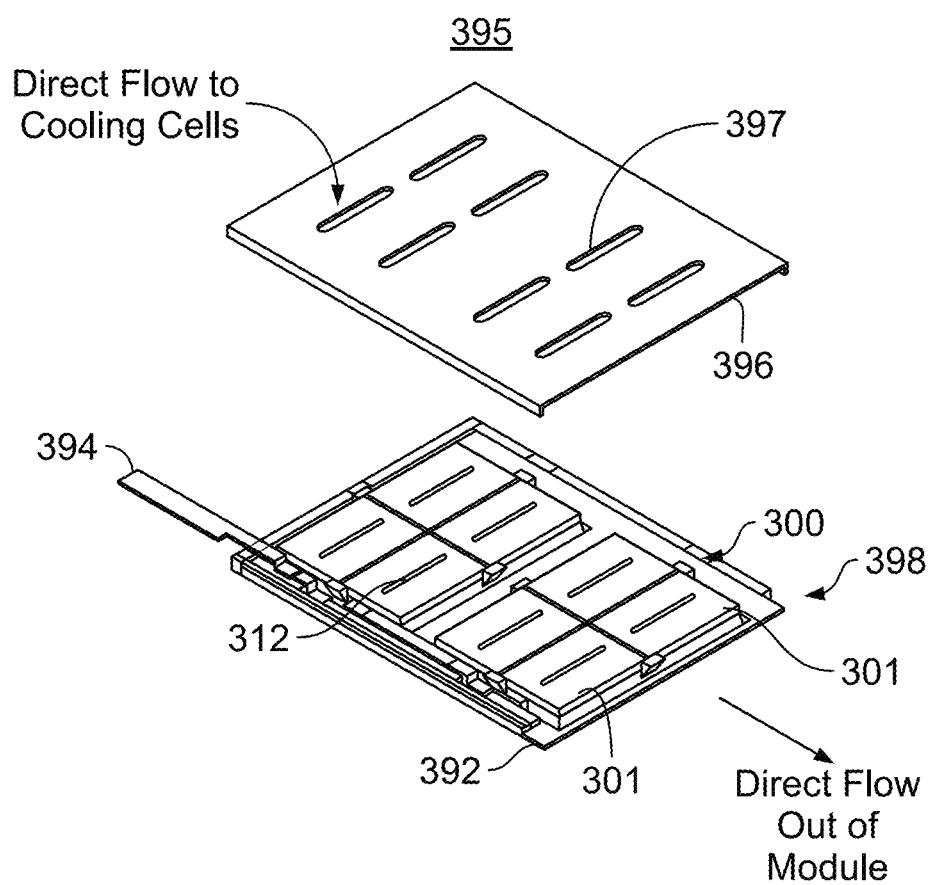

FIGS. 3A-3F depict an embodiment of active MEMS cooling system 300 including multiple cooling cells configured as a module termed a tile, or array. FIG. 3A depicts a perspective view, while FIGS. 3B-3E depict side views. FIG. 3F depicts module 395 including multiple cooling systems 300. FIGS. 3A-3F are not to scale. Cooling system 300 includes four cooling cells 301A, 301B, 301C and 301D (collectively or generically 301), which are analogous to one or more of cooling systems described herein. More specifically, cooling cells 301 are analogous to cooling system 100 and/or 200. Tile 300 thus includes four cooling cells 301 (i.e. four MEMS jets). Although four cooling cells 301 in a 2×2 configuration are shown, in some embodiments another number and/or another configuration of cooling cells 301 might be employed. In the embodiment shown, cooling cells 301 include shared top plate 310 having apertures 312, cooling elements 320, shared orifice plate 330 including orifices 332, top chambers 340, bottom chambers 350, anchors (support structures) 360, and pedestals 390 that are analogous to top plate 110 having apertures 112, cooling element 120, orifice plate 130 having orifices 132, top chamber 140, bottom chamber 150, anchor 160, and pedestal 190. In some embodiments, cooling cells 301 may be fabricated together and separated, for example by cutting through top plate 310, side walls between cooling cells 301, and orifice plate 330. Thus, although described in the context of a shared top plate 310 and shared orifice plate 330, after fabrication cooling cells 301 may be separated. In some embodiments, tabs (not shown) and/or other structures such as anchors 360, may connect cooling cells 301. Further, tile 300 includes heat-generating structure (termed a heat spreader hereinafter) 302 (e.g. a heat sink, a heat spreader, and/or other structure) that also has sidewalls, or fencing, in the embodiment shown. Cover plate 306 having apertures therein is also shown. Heat spreader 302 and cover plate 306 may be part of an integrated tile 300 as shown or may be separate from tile 300 in other embodiments. Heat spreader 302 and cover plate 306 may direct fluid flow outside of cooling cells 301, provide mechanical stability, and/or provide protection. Electrical connection to cooling cells 301 is provided via flex connector 380 (not shown in FIGS. 3B-3F) which may house drive electronics 385. Cooling elements 320 are driven out-of-phase (i.e. in a manner analogous to a seesaw). Further, as can be seen in FIGS. 3B-3C and FIGS. 3D-3E cooling element 320 in one cell is driven out-of-phase with cooling element(s) 320 in adjacent cell(s). In FIGS. 3B-3C, cooling elements 320 in a row are driven out-of-phase. Thus, cooling element 320 in cell 301A is out-of-phase with cooling element 320 in cell 301B. Similarly, cooling element 320 in cell 301C is out-of-phase with cooling element 320 in cell 301D. In FIGS. 3D-3E, cooling elements 320 in a column are driven out-of-phase. Thus, cooling element 320 in cell 301A is out-of-phase with cooling element 320 in cell 301C. Similarly, cooling element 320 in cell 301B is out-of-phase with cooling element 320 in cell 301D. By driving cooling elements 320 out-of-phase, vibrations in cooling system 300 may be reduced. Cooling elements 320 may be driven in another manner in some embodiments.

In some embodiments, two sets of four cooling cells 301 may be combined and integrated in a manner analogous to system 300. FIG. 3F is an exploded view of module 395 including two cooling systems 300 and, therefore, eight cooling cells 301. Cooling system 300 are enclosed in copper heat spreader 392 and cover 396 having vents 397 therein. Also shown is connector 396 that may house drive electronics analogous to drive electronics 385. Although not shown, vents 397 may have a dust cover that reduces or prevents the flow of dust (e.g. carried by the fluid flowing into vents 397) from reaching the internal portion of module 395 Such standardized modules 395 may facilitate incorporation into devices. Aperture 398 through which flow exits module 395 is between cover 396 and heat spreader 392. In some embodiments, aperture 398 occupies most or all of the side of module 395. In some embodiments, module 395 may be approximately forty to sixty millimeters on a side (e.g. forty-five millimeters by fifty-five millimeters) and not more than three millimeters thick. Module 395 may be capable of dissipating 10 W of power (while consuming not more than approximately 3 W of power). Direct flow through module 395 may be at least 0.3 cfm (e.g. on the order of 0.35 cfm) and entrained flow may be at least 0.5 cfm (e.g. 0.7 cfm or approximately twice the direct flow). Thus, the entrained airflow achieved using module 395 is at least the same as the direct airflow. In some embodiments, the entrained airflow is at least 1.5 multiplied by the direct airflow through module 395. In some embodiments, the entrained airflow may be twice the direct airflow through module 395. At such flows, the back pressure for module 395 may be not more than 2 kPa-2.2 kPa. Further, module 395 may have a top surface temperature that is significantly lower than the heat spreader (not shown in FIG. 3F) to which module 395 is coupled or heat spreader 392. This occurs because the active heat dissipation of module 395 starts from the region the fluid enters vents 397 opposite to heat spreader 392. Consequently, during operation the top surface of module 395 may be at least ten degrees Celsius cooler than a heat spreader 392 or other component to which module 395 is thermally coupled via heat spreader 392. In some embodiments, the top surface of module 395 is at least fifteen degrees Celsius cooler than heat spreader 392 during operation. The thin form factor (e.g. less than three millimeters thick), high back pressure and flow, little to no noise (e.g. less than 27 dBA) and low top surface temperature may facilitate use of module 395 in devices including but not limited to notebook computers.

Cooling cells 301 of cooling system 300 and module 395 functions in an analogous manner to cooling system(s) 100, 200, and/or an analogous cooling system. Consequently, the benefits described herein may be shared by cooling system 300 and module 395. Because cooling elements in nearby cells are driven out-of-phase, vibrations in cooling system 300 may be reduced. Because multiple cooling cells 301 are used, cooling system 300 may enjoy enhanced cooling capabilities. Further, multiples of individual cooling cells 301 and/or cooling system 300 may be combined in various fashions to obtain the desired footprint of cooling cells.

Figure 4A:
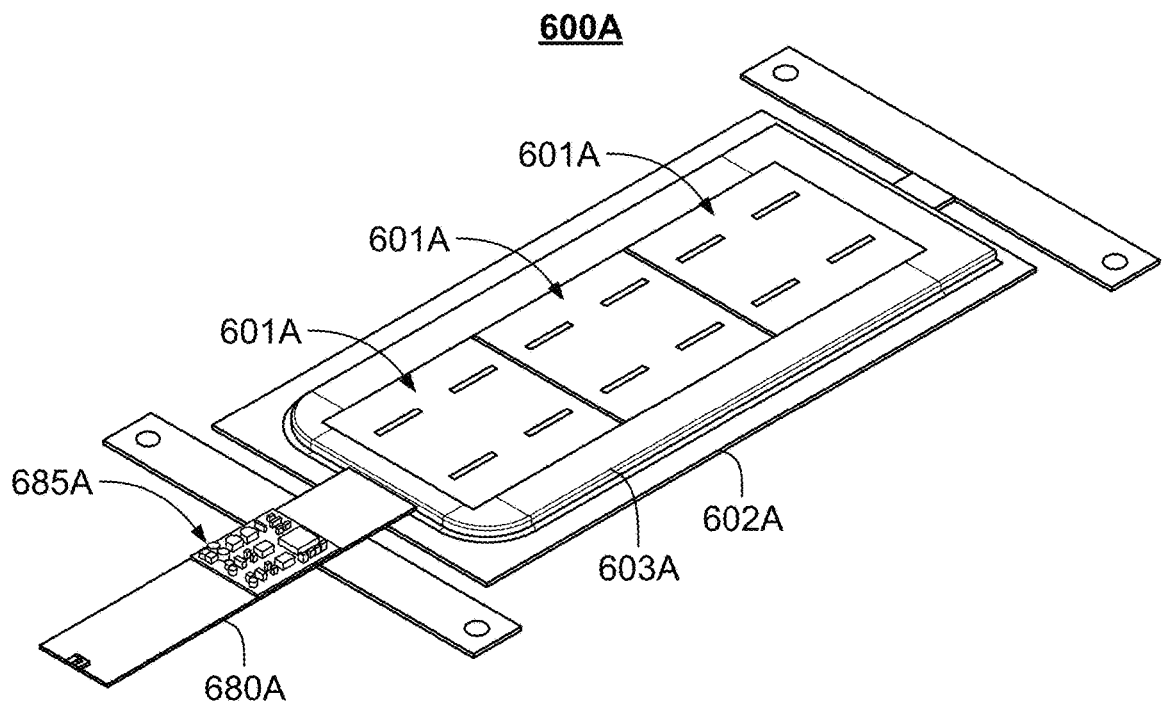
FIGS. 4A and 4B depict perspective views of embodiments of active MEMS cooling systems in which tiles are incorporated.
Figure 4B:
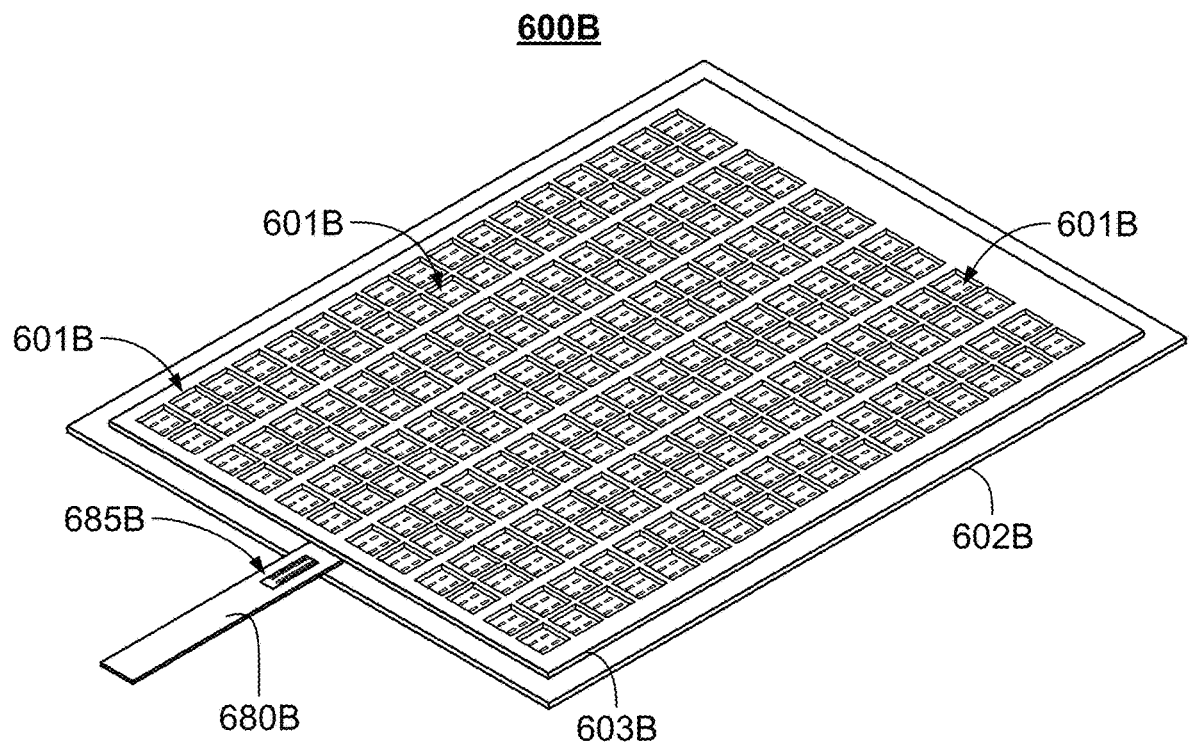

FIGS. 4A and 4B depict perspective views of embodiments of active MEMS cooling systems 600A and 600B in which tiles 601A and 601B are incorporated. FIGS. 4A-4B are not to scale and not all components are shown. Cooling system 600A includes three tiles 601A, which are analogous to tiles 300. Thus, each tile 601A includes four cooling cells (i.e. four MEMS jets) in the embodiment shown. Also shown are heat-generating structure 602A (e.g. a heat spreader), flex connector 680A and electronics 685A that are analogous to heat-generating structure 302, flex connector 380, and electronics 385. Drive electronics 685 can be located on the flex connector or on a separate board. MEMS cooling system 600A may be used in a computing device such as a laptop. Thus, cooling system 600A shares the benefits of cooling system 100, 400, and 500. Further, the addition of more tiles 601A allows MEMS cooling system 600A to provide additional cooling power.

Cooling system 600B is a perspective view of an embodiment of a cooling system that may be used in high power dissipation applications. For example, cooling system 600B may be utilized in a server system and/or other high power computing device. Cooling system 600B may be desired to dissipate at least 300 Watts, 800 Watts, 1600 Watts, 2400 Watts, 3200 Watts, or more. Cooling system 600B includes multiple tiles 601B (of which only three are labeled), each of which may be analogous to tile 500. The cover plates of tiles 601B are shown. Each tile 601B includes four cooling cells (i.e. four MEMS jets) in the embodiment shown. In other embodiments, each tile may include another number of cooling cells and/or another number of tiles 601B may be used. Also shown are heat-generating structure 602B, flex connector 680B and electronics 685B that are analogous to heat-generating structure 502, flex connector 580, and electronics 585. However, because cooling system 600B is desired to be utilized for high power dissipation applications, heat-spreading structure 602B may be a vapor chamber or analogous device (hereinafter vapor chamber). Vapor chamber 602B is, therefore, in thermal communication with a heat sources (not shown), such as high power processors utilized in a server system. Vapor chamber 602B may be used in lieu of a heat spreader in order to better spread heat across a larger surface and reduce the occurrence of hot spots. Thus, use of a vapor chamber 602B in combination with cooling system 600B may provide more efficient cooling for the structures (not shown) for which heat is desired to be dissipated. In some embodiments, heat-generating structure 602B is a heat spreader or other thermally conductive structure that is in thermally coupled with a vapor chamber that is part of a device desired to be cooled. However, in other embodiments, a heat spreader may be used. Vapor chamber 602B includes a high thermal conductivity material, such as copper. Also shown are ducts 603B surrounding tiles 601B. Ducting 603B is used to direct heated fluid (e.g. air) driven by tiles 601B.

Tiles 601B are arranged in an array. Although a rectangular array is shown, in some embodiments the array may have another shape. Cooling system 600B may be considered to include an array of MEMS jets arranged to cause a fluid to impinge on a surface of vapor chamber 602B. Cooling system 600 includes one hundred and ninety two tiles 601B and thus over seven hundred and twenty (i.e. seven hundred and sixty eight) MEMS jets. As discussed with respect to FIGS. 1A-1F, MEMs jets of cooling system 600B use vibrational motion of an actuator (i.e. a cooling element) to drive fluid (e.g. air) to impinge on vapor chamber 602B at high speed such as those described herein. For example, cooling system 600B may be capable of dissipating at least 1400 W (e.g. during steady state operation). In some embodiments, cooling systems having (the same or) another number of MEMS jets may be capable of dissipating other powers (e.g. at least 800 W, at least 1600 W, at least 2400 W, at least 3200 W, at least 3600 W and/or another power). Further, the profile of cooling system 600B may be low. As indicated previously, the thickness of tiles 601B including MEMS jets is less than 1.5 millimeter. For example, the thickness of tiles 601B may be 1-1.3 millimeter in some embodiments. In some embodiments, tiles 601B may be on the order of 1-1.5 mm or less. Vapor chamber 602B may be nominally five millimeters in some embodiments. Ducting 603B may be nominally five millimeters thick. Consequently, cooling system 600B may be not more than fifteen millimeters thick in some embodiments. In some embodiments, cooling system 600B may be not more than twenty-five millimeters thick.

In operation, cooling elements in tiles 601B are driven in a manner analogous to that described for cooling system 100. Thus, tiles 601B use vibrational motion of cooling elements therein to drive fluid (e.g. air) toward vapor chamber 602B at high speed. For example, the jets have a velocity of greater than 30 meters per second. The MEMS jets of tiles 601B drive the fluid to impinge on the surface of vapor chamber 602B. The fluid cools vapor chamber 602B and is directed to an outlet or other cooling mechanism by ducting system 603B. Thus, cool fluid is directed toward the inlets in tiles 601B and heated fluid used to cool vapor chamber 602B is carried away from cooling system 600B.

Figure 5:
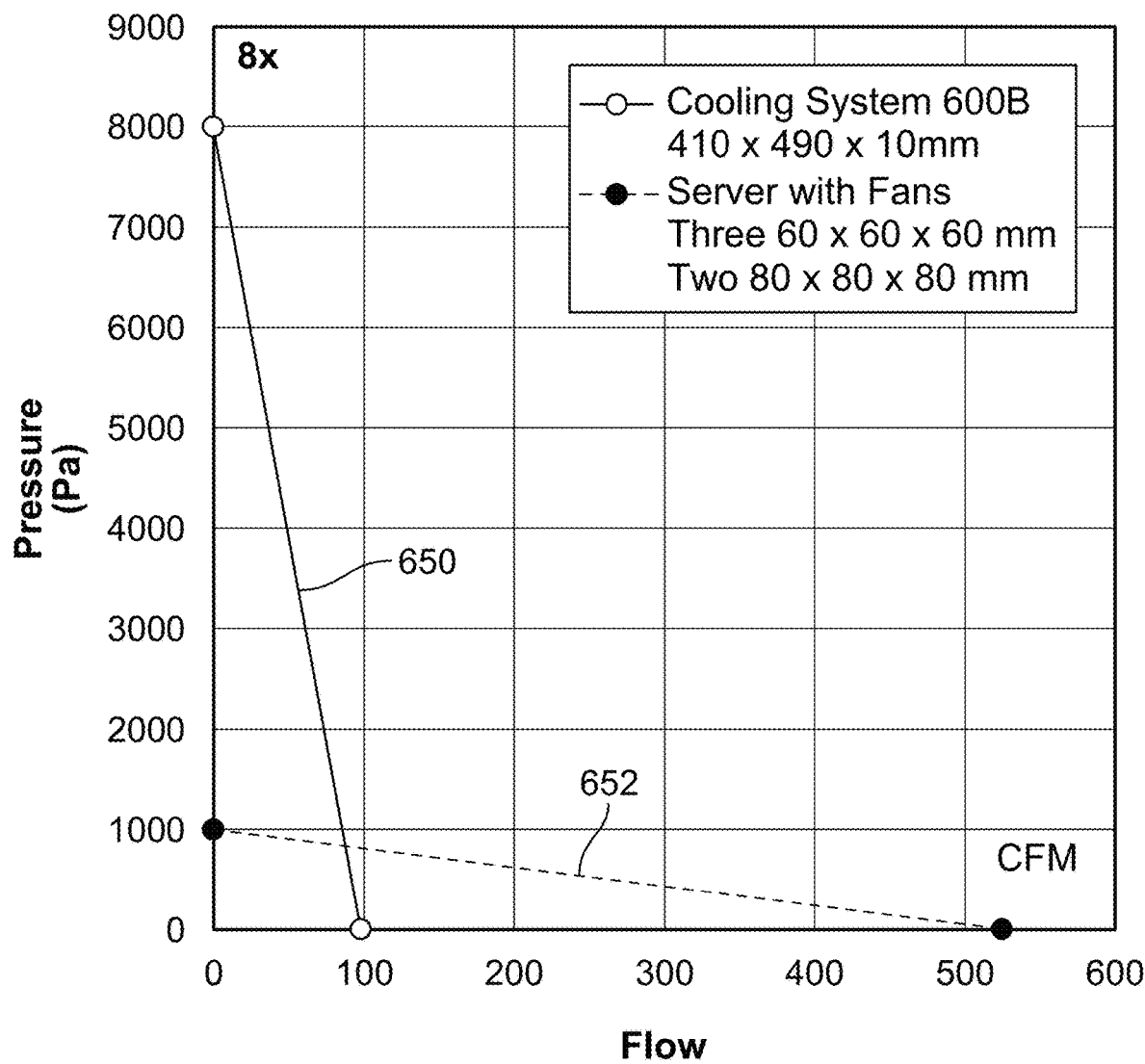
FIG. 5 is a graph of pressure versus flow indicating performance of an embodiment of an active MEMS cooling system.

Thus, cooling system 600B shares the benefits of cooling systems 100, 200, 300, and 395. In addition, cooling system 600B has enhanced cooling capabilities. Cooling system 600B may be used to cool systems requiring high power dissipation, such as servers. This is indicated in FIG. 5, depicts a graph of pressure versus flow and that indicates the performance of an active MEMS cooling system versus that of fans. Line 650 indicates the performance of active MEMS cooling system, while line 652 indicates the performance of a set of fans. In some embodiments, cooling system 600B may dissipate 1400 W of heat drawing on the order of 163 W of power with an air flow of nominally sixty-five cubic feet per minute (CFM) with an air velocity of on the order two hundred kilometers per hour. An analogous traditional cooling system using five fans and drawing approximately the same power (e.g. 164 W) requires a flow of approximately two hundred and sixty CFM with an air velocity of nominally twenty kilometers per hour and dissipates only eight hundred watts of heat. MEMS cooling system 600B also provides greater cooling than conventional systems employing fans at a smaller profile. For example, in some embodiments, cooling system 600B may be not more than half of the height of a cooling system employing fans. For example, as discussed above, cooling system 600B may have a height of not more than thirty millimeters in some embodiments. In some such embodiments, cooling system has a height of not more than twenty millimeters. For example, cooling system 600B may be nominally not more than fifteen millimeters tall. In contrast, a traditional 5-fan system may be forty-five millimeters in height or taller. Thus, more server systems and cooling systems 600B may be provided in a particular server rack. In addition, MEMS cooling system 600B need not use liquids for cooling. Consequently, reliability and safety issues that may occur when using fluids for cooling electronics may be avoided. Further, an external chiller may be unnecessary. Instead, cooling system 600B may draw fluid (e.g. air) from the cool aisle and exhaust heated fluid to the hot aisle in a data center. Thus, performance, compactness, efficiency, and reliability may be improved for high power dissipation applications such as servers. Cooling system 600B may also entrain fluid that does not travel through tiles 601B. Such entrained fluid may be blended with fluid carrying heat from vapor chamber 602B. As a result, fluid exhausted by cooling system 600B may have a moderate temperature.

Figure 6A:
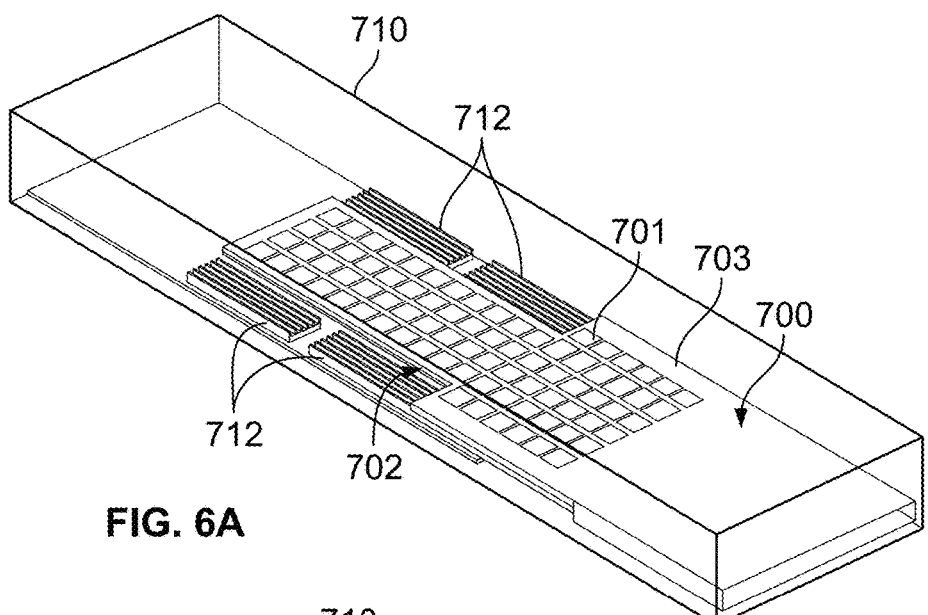
FIGS. 6A-6C depict an embodiment of an active MEMS cooling system within a chassis of a server that may be used in a data center.
Figure 6B:
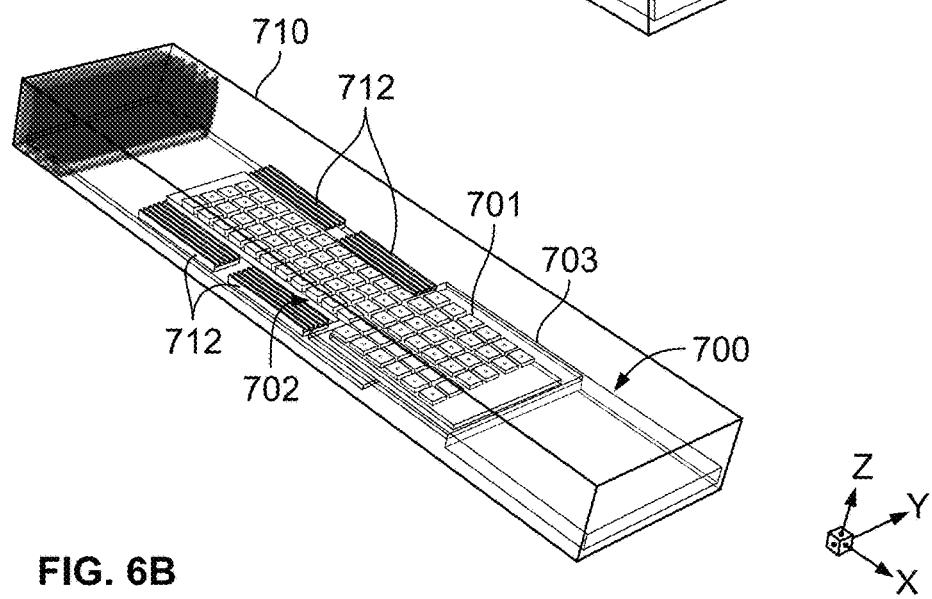
Figure 6C:
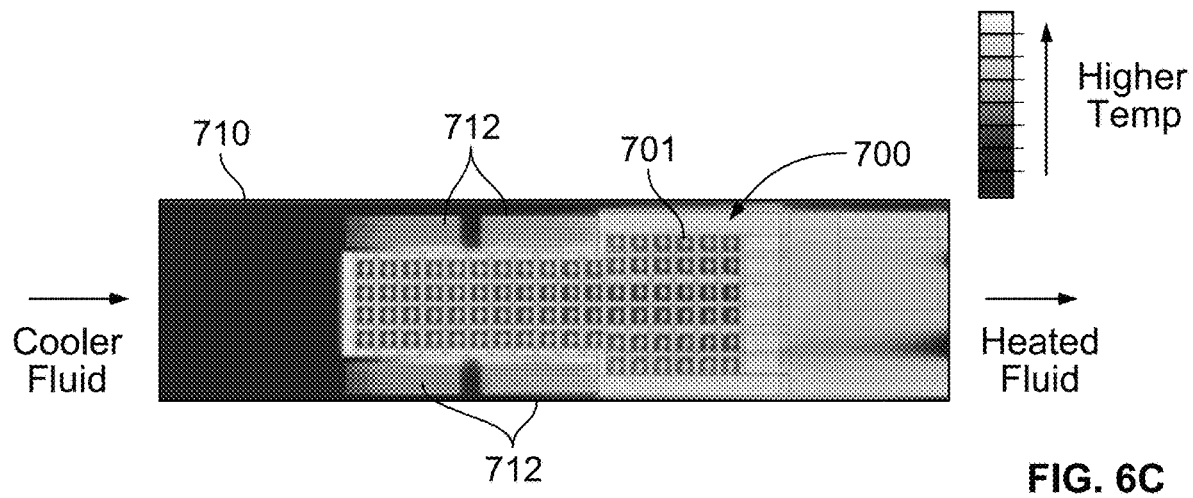

FIGS. 6A-6C depict an embodiment of MEMS cooling system 700 within a chassis 710 of a server that may be used in a data center. FIGS. 6A-6B are perspective views, while FIG. 6C is a top view indicating a heat map. For clarity, FIGS. 6A-6C are not to scale and not all components are shown. For example, processors 712 being cooled by cooling system 700 are shown. However, memory and other components are omitted. MEMS cooling system 700 includes cooling tiles 701 (of which only one is labeled), ducting 703, and vapor chamber 702. In the embodiment shown, each tile 701 includes four cooling cells (not explicitly labeled in FIGS. 6A-6C). In some embodiments, approximately seven hundred and forty cooling cells are present and cooling system 700 may be not more than 420 mm wide, 500 mm long, and 10 mm high. Thus, cooling system 700 is compact. Tiles 701 are also arranged in an array that is not rectangular. Vapor chamber 702 may be approximately five millimeters thick. Thus, the cooling system 700 may have a small profile analogous to that described in the context of cooling system 600. As indicated by the heat map in FIG. 6C, cooler fluid (e.g. air) is drawn into chassis 710, driven by MEMS cooling system 700 via vibrational motion, and used to cool processors 712. The fluid carries off the heat generated by processors 712.

Cooling system 700 shares the benefits of cooling systems 100, 200, 300, 395, 600A and/or 600B. Cooling system 700 may be used to cool server system 710, which requires high power dissipation. In some embodiments, cooling system 700 may dissipate at least 1400 W of heat while occupying less space than a traditional fan system. For example, cooling system 700 may have a height of not more than thirty millimeters in some embodiments. In some such embodiments, cooling system 700 has a height of not more than twenty-six millimeters. For example, cooling system 700 may be nominally not more than fifteen millimeters tall. Thus, more server systems and cooling systems 700 may be provided in a particular server rack. In addition, MEMS cooling system 700 need not use liquids for cooling. Consequently, reliability and safety issues that may occur when using fluids for cooling electronics may be avoided. Further, an external chiller may be unnecessary. Instead, cooling system 700 may draw fluid (e.g. air) from the cool aisle and exhaust heated fluid to the hot aisle in a data center. Thus, performance, compactness, efficiency, and reliability may be improved for high power dissipation applications such as servers. Cooling system 700 may also entrain fluid and use the entrained fluid to reduce the temperature of heated fluid exiting chassis 710.

Figure 7A:
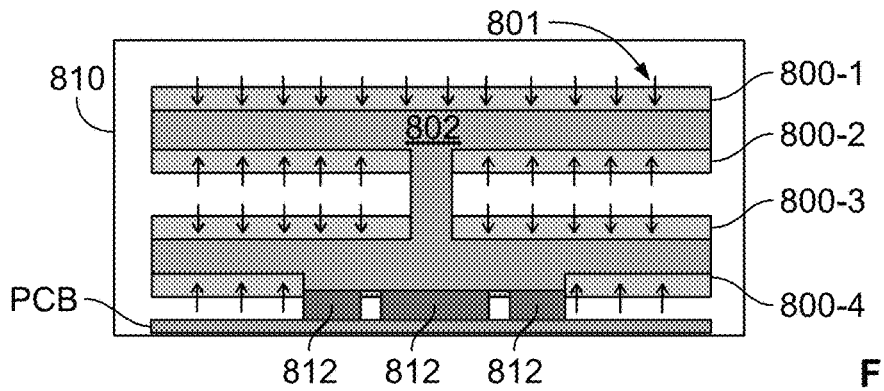
FIGS. 7A-7D depict an embodiment of an active MEMS cooling system within a chassis of a server that may be used in a data center.
Figure 7B:
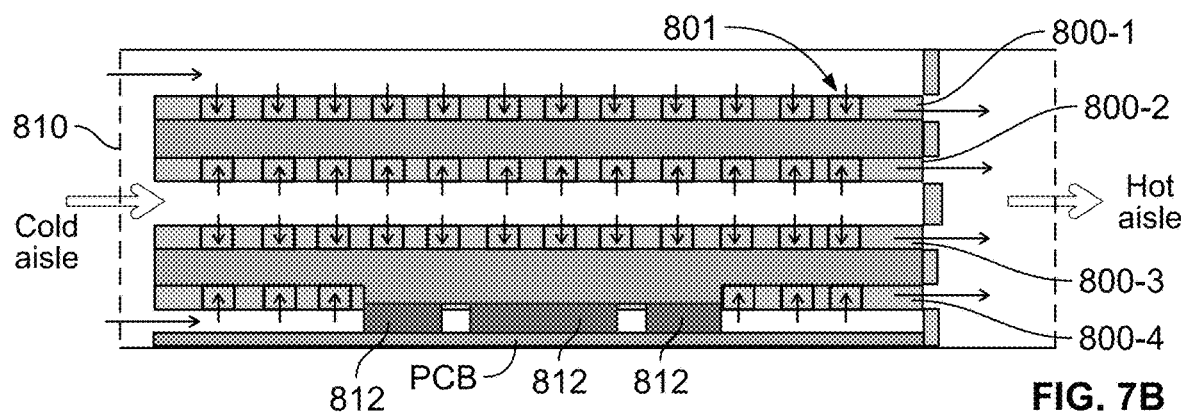
Figure 7C:
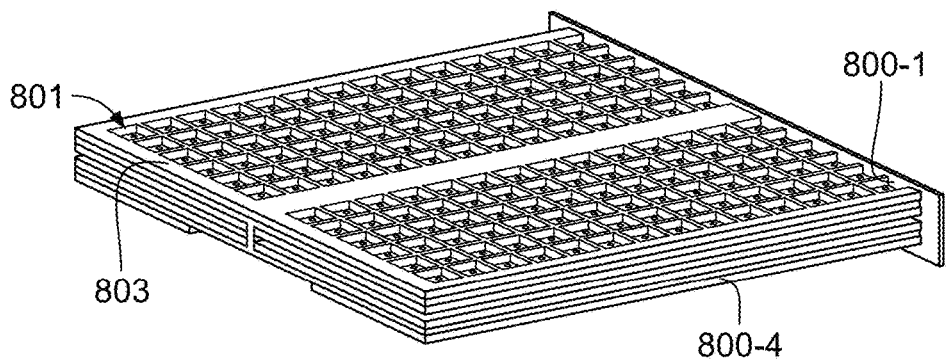
Figure 7D:
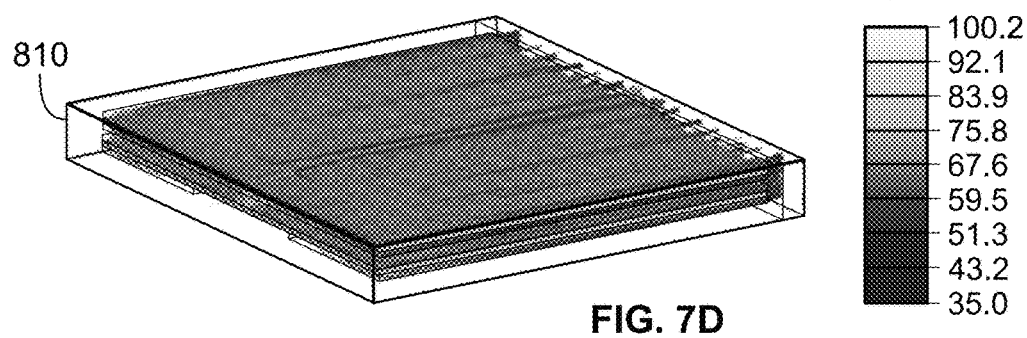

FIGS. 7A-7D depict an embodiment of active MEMS cooling system 800 (including cooling systems 800-1, 800-2, 800-3, and 800-4) within a chassis 810 of a server that may be used in a data center. FIGS. 7A and 7B are front and side views, respectively. FIGS. 7C and 7D are perspective views of system 800. FIG. 7D indicates fluid flow and temperature. For clarity, FIGS. 7A-7D are not to scale and not all components are shown. For example, processors (or switch components) 812 on printed circuit board (PCB) being cooled by cooling system 800 are shown. However, memory and other components are omitted. Each active MEMS cooling system 800 includes cooling tiles 801 (of which only one is labeled), ducting 803, and vapor chamber 802. In the embodiment shown, each tile 801 includes four cooling cells (not explicitly labeled in FIGS. 7A-7D). Vapor chamber 802 includes multiple interconnected tiers (which may also be considered horizontal fins). In the embodiment shown, the tiers are parallel to the PCB, but the tiers may have another orientation in some embodiments. Cooling system 800 drives fluid (e.g. air) on multiple surfaces of each tier. This is indicated by the arrows in FIGS. 7A and 7B. Thus, cooling systems 800-4 and 800-3 drive fluid onto opposing surfaces of the first tier of cooling vapor chamber 802. Cooling systems 800-2 and 800-1 drive fluid onto opposing surfaces of the second tier of vapor chamber 802. The tiers are connected via a central, vertical portion of vapor chamber 802. In some embodiments, another number of tiers may be present. For example, vapor chamber 802 may include a single tier or may include three or more tiers. Each tier may have corresponding cooling system(s) driving fluid onto one or more surfaces of the vapor chamber. Although multiple tiers are present, the total height of vapor chamber 802 and cooling systems 800 may be relatively small. For example, the total height may be not more than thirty millimeters and/or may be less than that of a traditional fan system, while cooling systems 800 may still provide significantly higher cooling power.

In operation, cooler air may be drawn into chassis 810 from the cool aisle. The cooler fluid is used by cooling systems 800 to dissipate heat from vapor chamber 802, and thus processors 812. The heated fluid (e.g. carrying heat generated by processors 812) is exhausted to the hot aisle. As indicated by the fluid flow in FIG. 7D, cooler fluid is drawn into chassis 810, driven by MEMS cooling system 800 via vibrational motion can cool vapor chamber 802, which is thermally connected to processors 812. The fluid carries off the heat generated by processors 812. In some embodiments, up to 200 CFM (or more) may be driven by cooling systems 800.

Cooling system 800 shares the benefits of cooling systems 100, 200, 300, 395, 600A, 600B, and/or 700. Cooling system 800 may be used to cool server system 810, which requires high power dissipation. In some embodiments, cooling system 800 may dissipate at least 1400 W, 2400 W, 3200 W, 3600 W or more while occupying less space than a traditional fan system. In addition, MEMS cooling system 800 need not use liquids for cooling. Consequently, reliability and safety issues that may occur when using fluids for cooling electronics may be avoided. Further, an external chiller may be unnecessary. Instead, cooling system 800 may draw fluid (e.g. air) from the cool aisle and exhaust heated fluid to the hot aisle in a data center. Thus, performance, compactness, efficiency, and reliability may be improved for high power dissipation applications such as servers. Further, cooling system 800 may entrain fluid that does not travel through tiles 801. Such entrained fluid may not be used to directly cool processors 812. Instead, the entrained fluid may be blended with heated fluid carrying heat from vapor chamber 802. As a result, fluid leaving system 810 may have a moderate temperature.

Figure 8A:
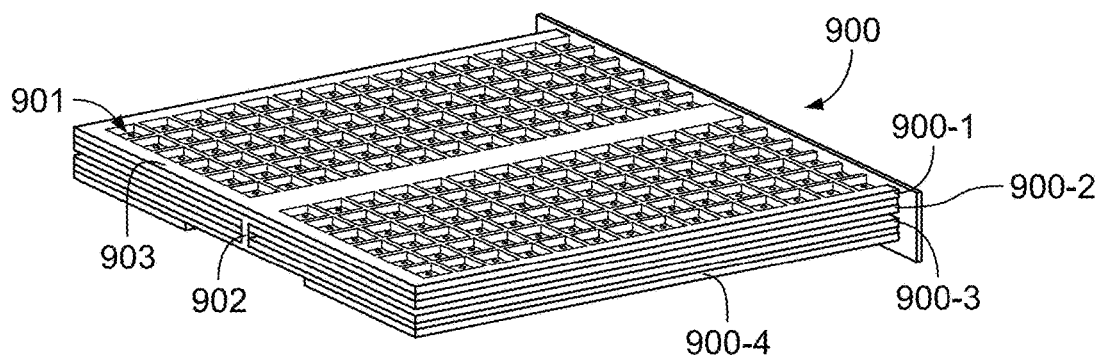
FIGS. 8A-8D depict an embodiment of an active MEMS cooling system that may be used for a data center network hub.
Figure 8B:
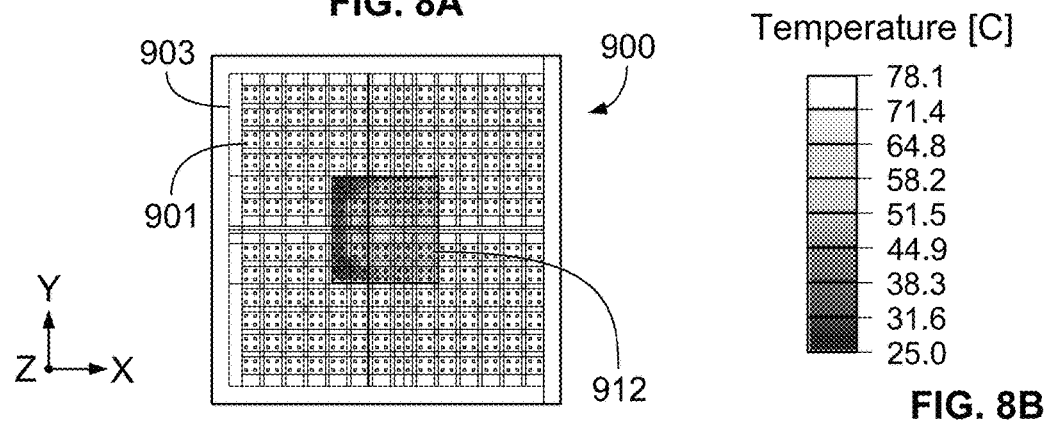
Figure 8C:
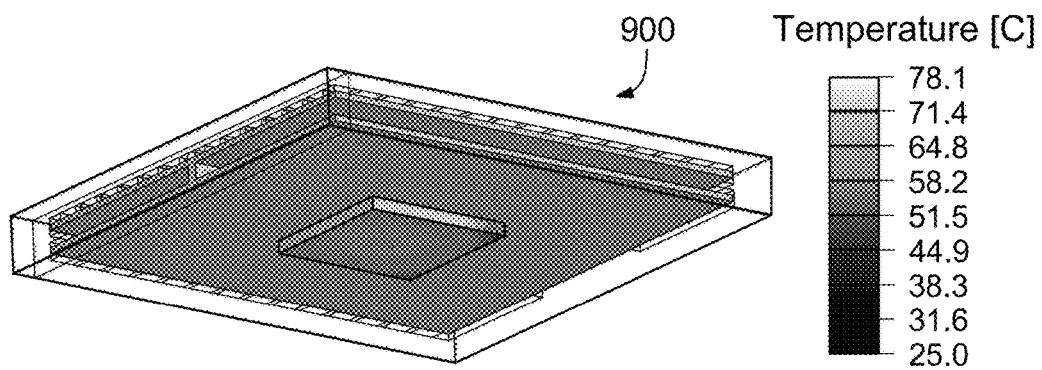
Figure 8D:
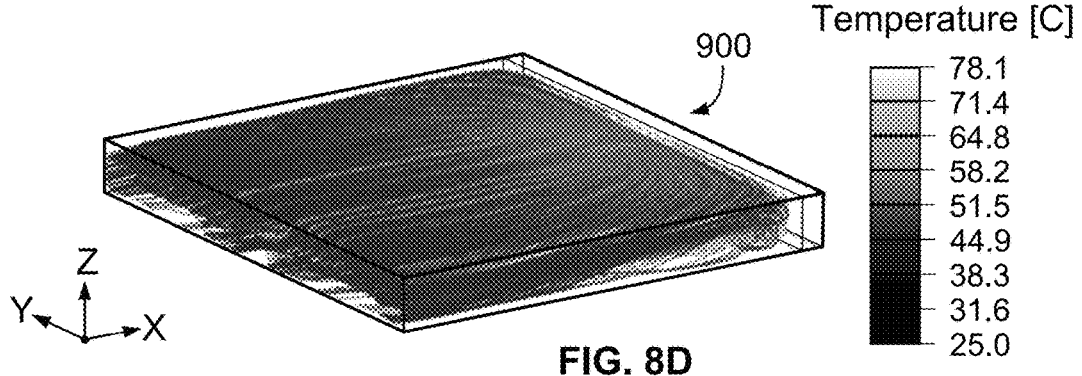

FIGS. 8A-8D depict an embodiment of active MEMS cooling system 900 (including cooling systems 900-1, 900-2, 900-3, and 900-4) that may be used for a data center network hub. FIGS. 8A and 8B are perspective and top views, respectively. FIGS. 8C and 8D are perspective views. FIGS. 8B, 8C, and 8D include heat maps. For clarity, FIGS. 8A-8D are not to scale and not all components are shown. Each active MEMS cooling system 900 includes cooling tiles 901 (of which only one is labeled), ducting 903, and vapor chamber 902. In the embodiment shown, each tile 901 includes four cooling cells (not explicitly labeled in FIGS. 8A-8D). Vapor chamber 902 includes multiple interconnected tiers (which may also be termed fins). Further cooling systems 900 drive fluid (e.g. air) on multiple surfaces of each tier. Thus, cooling systems 900 are analogous to cooling systems 800. In operation, cooler air may be drawn in from the cool aisle and driven by cooling tiles 901. The cooler fluid is used by cooling systems 900 to dissipate heat from vapor chamber 902, and thus from network hub 912. The heated fluid is exhausted to the hot aisle. As indicated by the heat maps in FIGS. 8B-8D, cooler fluid drawn in and driven by MEMS cooling system 900 via vibrational motion can cool hub 912. The fluid carries off the heat generated by hub 912.

Cooling system 900 shares the benefits of cooling systems 100, 200, 300, 395, 600A, 600B, 700, and/or 800. Cooling system 900 may be used to cool network hub, which requires high power dissipation. In some embodiments, cooling system 900 may dissipate at least 2400 W, 3200 W, 3600 W or more while occupying less space than a traditional fan system. In addition, MEMS cooling system 900 need not use liquids for cooling. Consequently, reliability and safety issues that may occur when using fluids for cooling electronics may be avoided. Further, an external chiller may be unnecessary. Instead, cooling system 900 may draw fluid (e.g. air) from the cool aisle and exhaust heated fluid to the hot aisle in a data center. Thus, performance, compactness, efficiency, and reliability may be improved for high power dissipation applications such as servers. Cooling system 900 may also entrain fluid that does not travel through tiles 901. Such entrained fluid may be blended with fluid carrying heat from vapor chamber 902. As a result, fluid exhausted by cooling system 900 may have a moderate temperature.

Figure 9A:
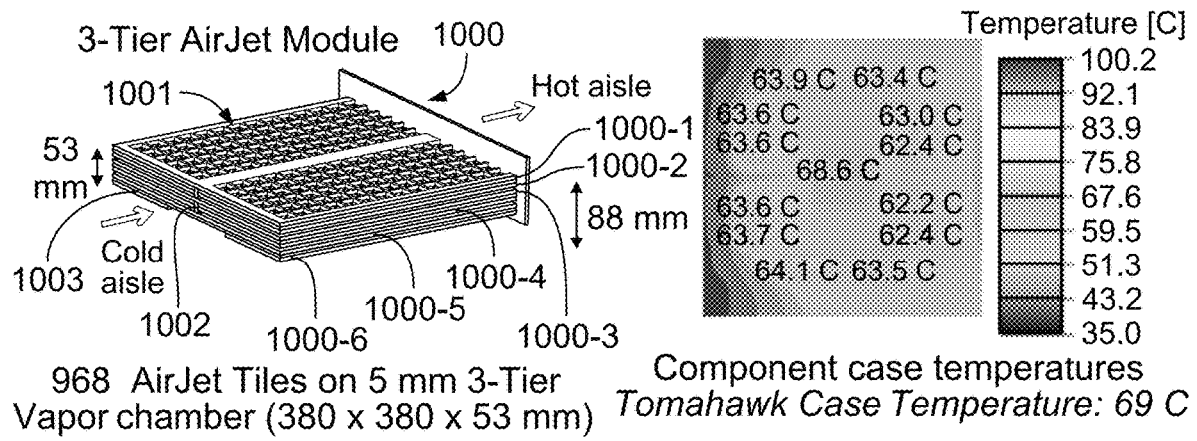
FIGS. 9A-9D depict perspective views of an embodiment of an active MEMS cooling system.
Figure 9B:
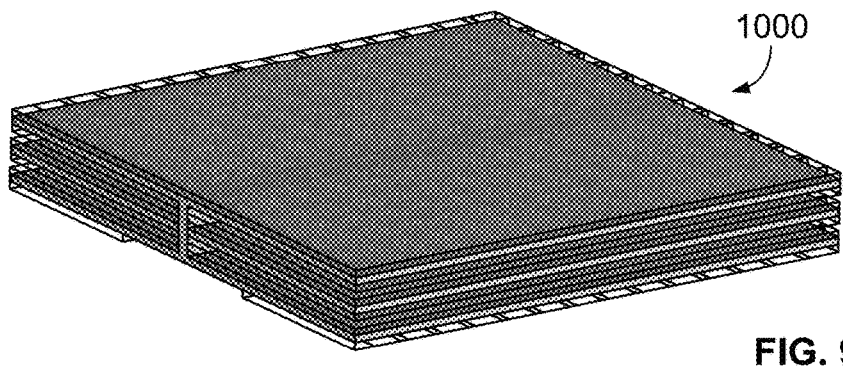
Figure 9C:
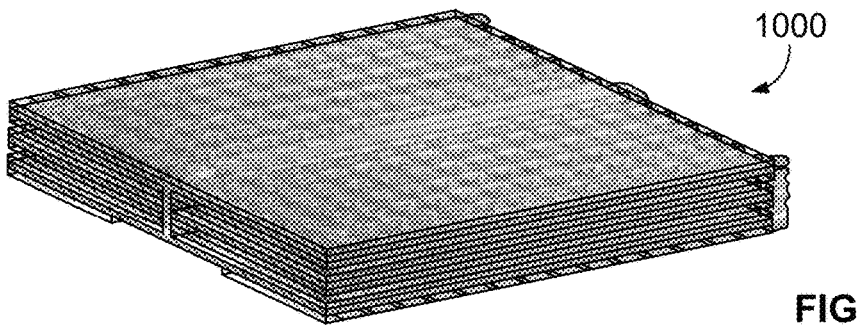
Figure 9D:
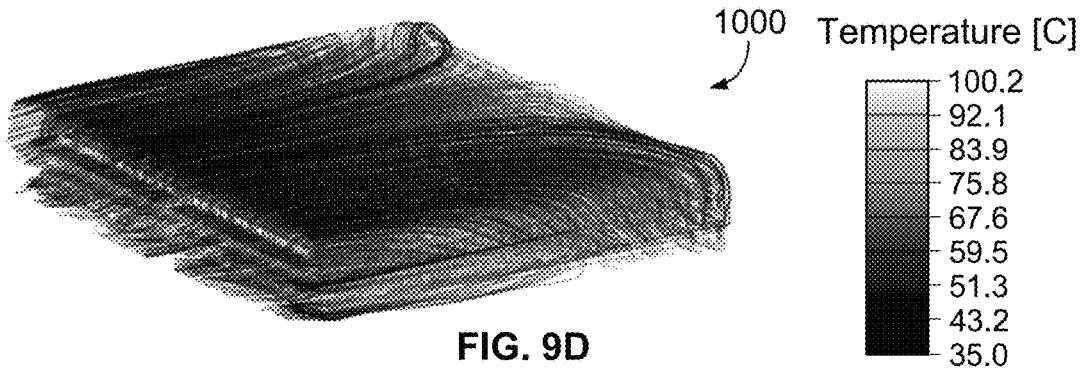

FIGS. 9A-9D depict perspective views of an embodiment of active MEMS cooling system 1000 (including cooling systems 1000-1, 1000-2, 1000-3, 1000-4, 1000-5, and 1000-6). Thus, FIGS. 9A-9D depict a three tier cooling system. FIGS. 9B-9D depict the temperature of the vapor chamber and flow. For clarity, FIGS. 9A-9D are not to scale and not all components are shown. Each active MEMS cooling system 1000 includes cooling tiles 1001 (of which only one is labeled), ducting 1003, and vapor chamber 1002. In the embodiment shown, each tile 1001 includes four cooling cells (not explicitly labeled in FIGS. 9A-9D). Vapor chamber 1002 includes three interconnected tiers. Further cooling systems 1000 drive fluid (e.g. air) on multiple surfaces of each tier. Thus, cooling systems 1000 have a structure and function analogous to cooling systems 800 and/or 900.

Cooling system 1000 shares the benefits of cooling systems 100, 200, 300, 395, 600A, 600B, 700, 800 and/or 900. Cooling system 1000 may be used to cool high power dissipation systems. In some embodiments, cooling system 1000 may dissipate at least 2400 W, 3200 W, 3600 W or more while occupying less space than a traditional fan system. In addition, MEMS cooling system 1000 need not use liquids for cooling. Consequently, reliability and safety issues that may occur when using fluids for cooling electronics may be avoided. Further, an external chiller may be unnecessary. Thus, performance, compactness, efficiency, and reliability may be improved for high power dissipation applications such as servers. Cooling system 1000 may also entrain fluid that does not travel through tiles 1001 and blend the entrained fluid with heated fluid. As a result, fluid exhausted by cooling system 1000 may have a moderate temperature.

Figure 10A:
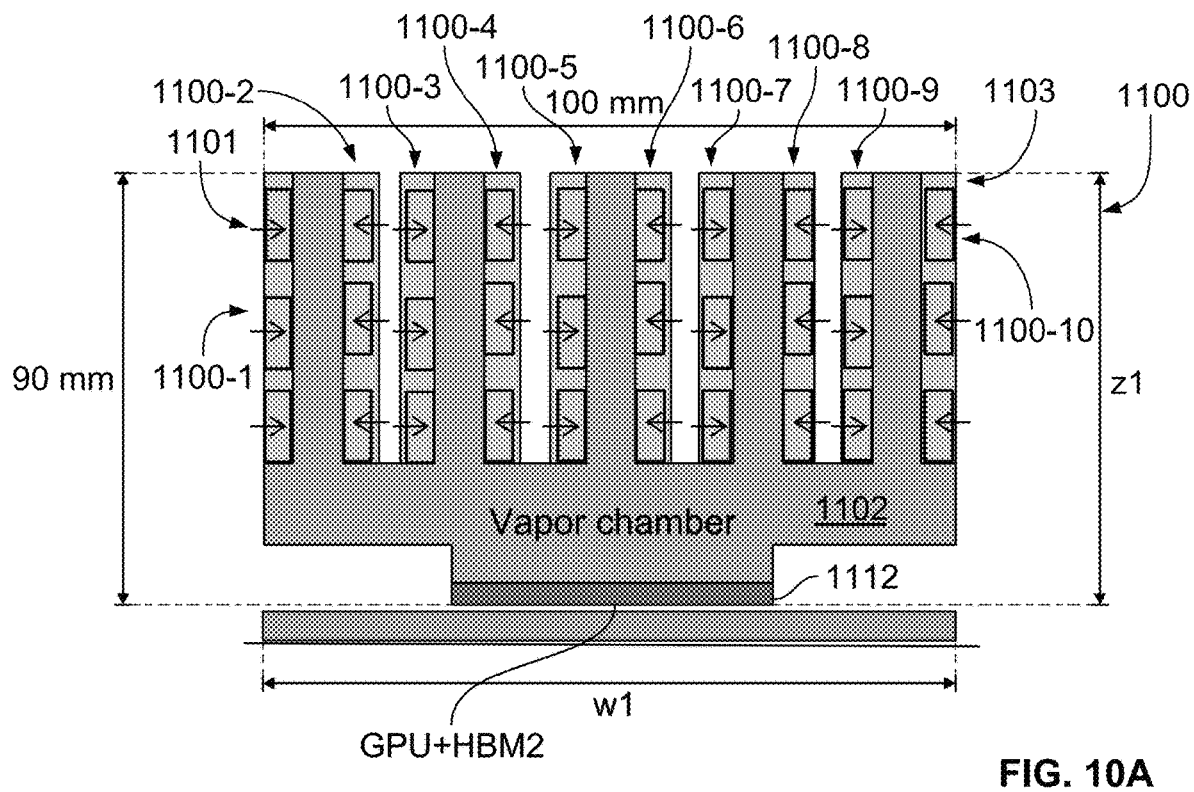
FIGS. 10A-10D depict an embodiment of an active MEMS cooling system.
Figure 10B:
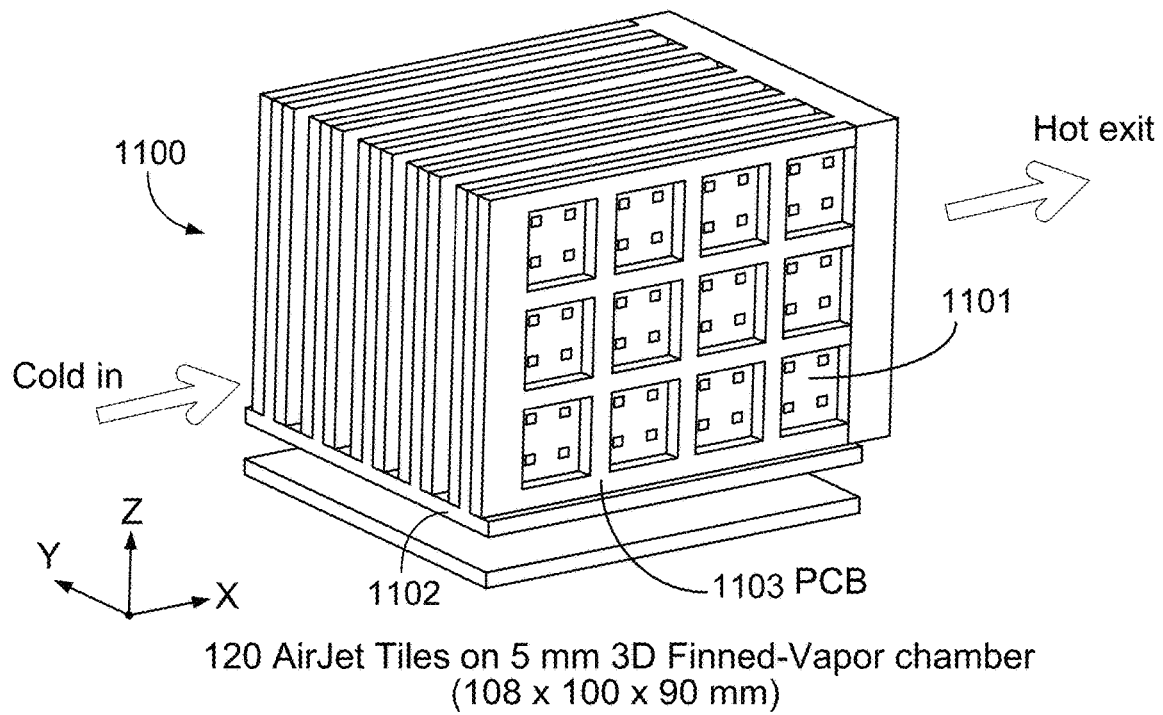
Figure 10C:
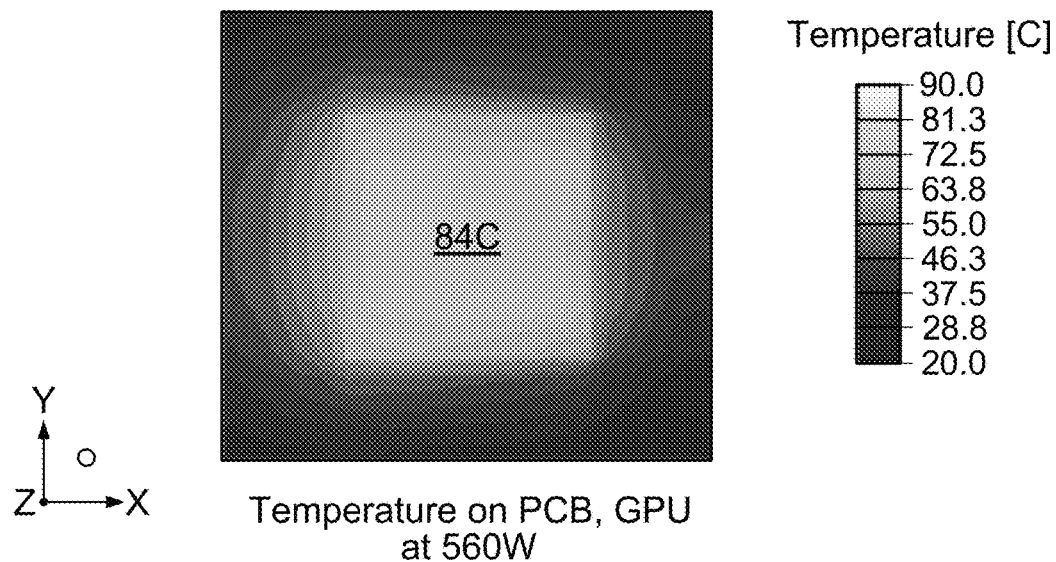
Figure 10D:
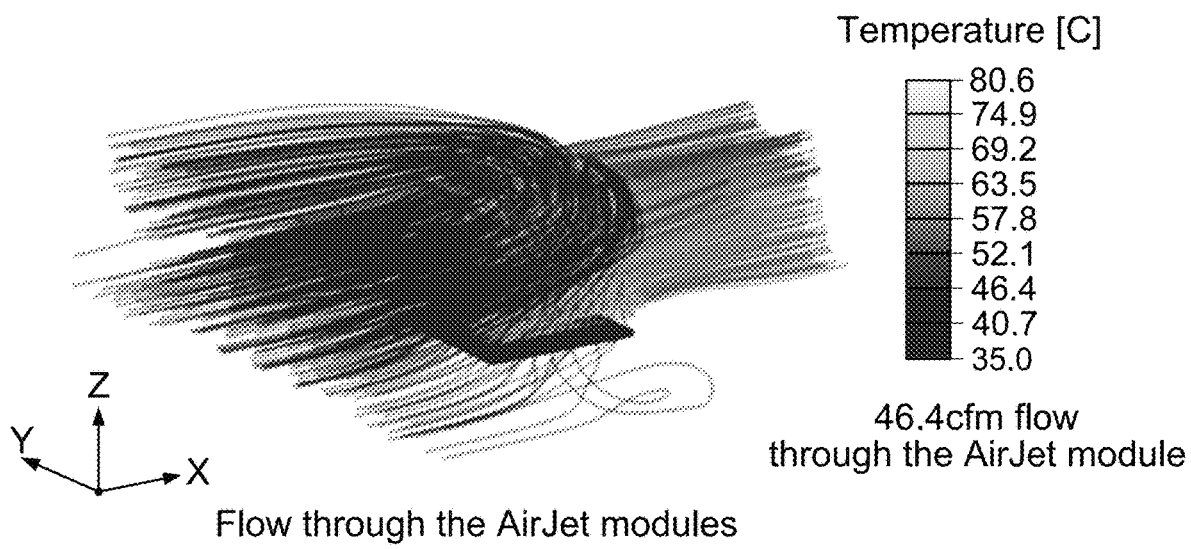

FIGS. 10A-10D depict an embodiment of active MEMS cooling system 1100 (including systems 1100-1, 1100-2, 1100-3, 1100-4, 1100-5, 1100-6, 1100-7, 1100-8, 1100-9, and 1100-10 that are referred to collectively or generally as 1100). FIGS. 10A-10D depict a cooling system using multiple vertical tiers. For clarity, FIGS. 10A-10D are not to scale and not all components are shown. Each active MEMS cooling system 1100 includes cooling tiles 1101 (of which only one is labeled), ducting 1103, and vapor chamber 1102 having multiple vertical fins. In the embodiment shown, each tile 1101 includes four cooling cells (not explicitly labeled in FIGS. 10A-10D). Vapor chamber 1102 includes five interconnected vertical fins. Further cooling systems 1100 drive fluid (e.g. air) on multiple surfaces of each fin. Thus, cooling system 1100 has a structure and function analogous to cooling systems 800, 900, and/or 1000. Vapor chamber 1102 is thermally connected to processor 1112, which may be a GPU in the embodiment shown. As indicated in FIG. 10A, in some embodiments, the height ($z1$) of such a system may be nominally ninety millimeters and the width ($w1$) may be nominally one hundred millimeters. Other heights and widths are possible. In addition, as shown in FIG. 10B, active MEMS cooling system 1100 may intake fluid (i.e. air) from the cold aisle and exhaust heated fluid to the hot aisle.

Cooling system 1100 shares the benefits of cooling systems 100, 200, 300, 395, 600A, 600B, 700, 800, 900 and/or 1000. Cooling system 1100 may be used to cool high power dissipation systems. In some embodiments, cooling system 1100 may dissipate at least 2400 W, 3200 W, 3600 W or more while occupying less space than a traditional fan system. For example, cooling system 1100 and vapor chamber 1102 may have a height of approximately ninety millimeters or less and a width of not more than one hundred millimeters. Other sizes and/or other numbers of fins, tiles, and/or cooling cells are possible. In addition, MEMS cooling system 1100 need not use liquids for cooling. Consequently, reliability and safety issues that may occur when using fluids for cooling electronics may be avoided. Further, an external chiller may be unnecessary. Thus, performance, compactness, efficiency, and reliability may be improved for high power dissipation applications such as servers. Cooling system 1100 may also entrain fluid that does not travel through tiles 1101 and blend the entrained fluid with heated fluid. As a result, fluid exhausted by cooling system 1100 may have a moderate temperature.

Figure 11A:
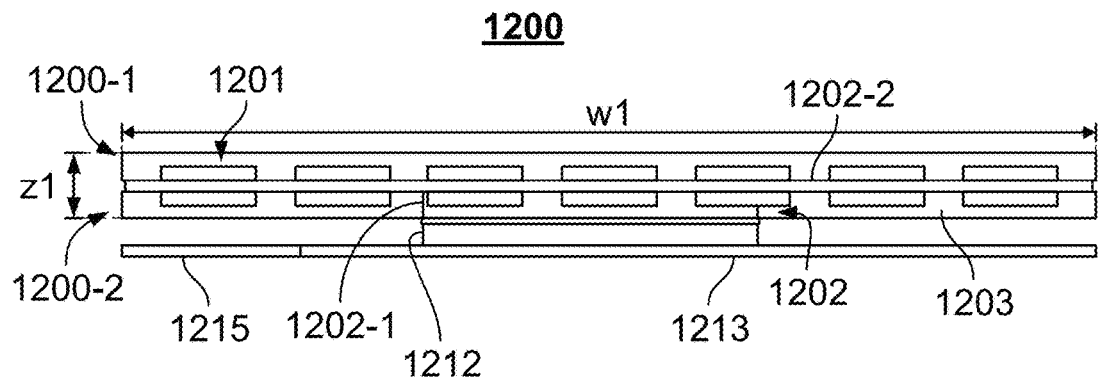
FIGS. 11A-11B depict an embodiment of an active MEMS cooling system.
Figure 11B:
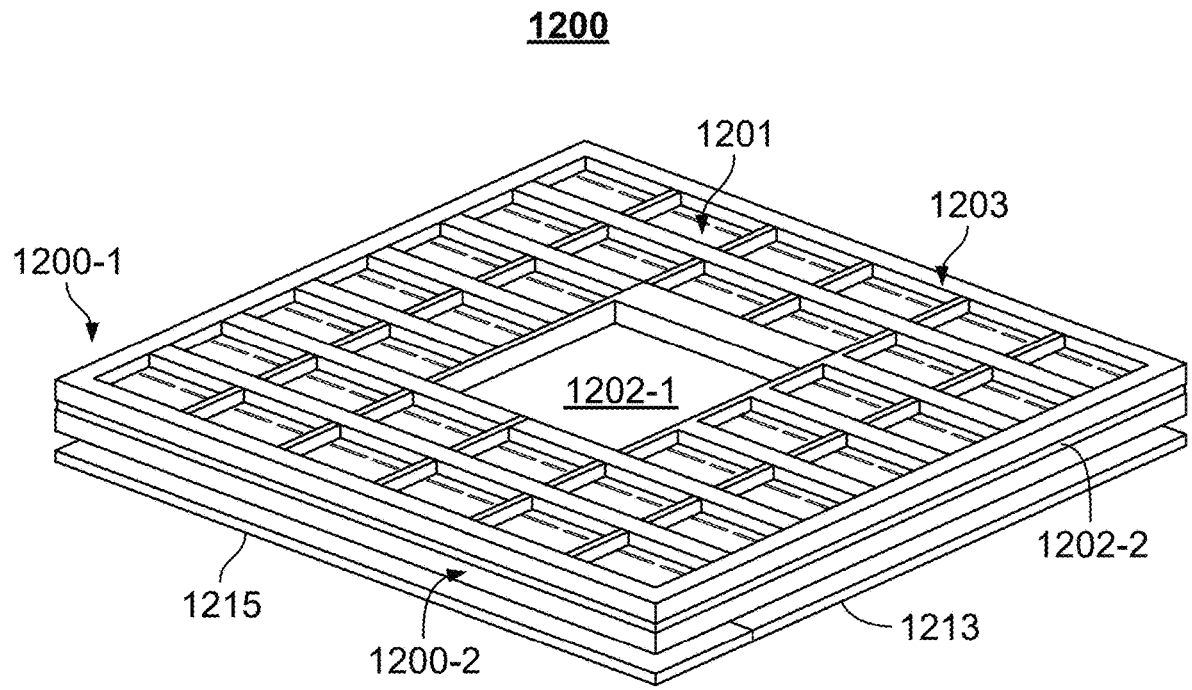

FIGS. 11A-11B depict an embodiment of active MEMS cooling system 1200 including vapor chamber 1202 and cooling systems 1200-1 and 1200-2. For clarity, FIGS. 11A-11B are not to scale and not all components are shown. Each active MEMS cooling system 1200-1 and 1200-2 includes cooling tiles 1201 (of which only one is labeled) and ducting 1203 (of which only one is labeled). Cooling systems 1200-1 and 1200-2 are thermally coupled to vapor chamber 1202. More specifically, cooling system 1200 uses multiple surfaces of vapor chamber 1202. Thus, in the embodiment shown, cooling system 1200-1 is on the opposite side of vapor chamber 1202 from cooling system 1200-2. In the embodiment shown, cooling systems 1200-1 and 1200-1 each includes thirty-six tiles and each tile 1201 includes four cooling cells (not explicitly labeled in FIGS. 11A-11B). Thus, cooling system 1200 has a structure and function analogous to cooling systems 800, 900, 1000, and/or 1100.

In the embodiment shown, vapor chamber 1202 is thermally coupled with processor 1212, which is connected to circuit board 1213. Vapor chamber 1202 includes a module connector 1202-1 and a wider horizontal fin 1202-2. Cooling systems 1200-1 and 1200-1 thus drive a fluid onto at least the surface of horizontal fin 1202-2. Also shown is driving board 1215, which may be integrated into or adjacent to circuit board 1213. In some embodiments, driving board 1215 includes drive electronics for cooling system 1200 and may thus be considered part of cooling system 1200.

Cooling system 1200 allows the cooling systems to be stacked to enable scaling and higher cooling performance. Stated differently, cooling system 1200 may be considered a single cooling module 1200 of a modular cooling system. FIGS. 11A-11B depict a single tier, or module, cooling system. Such a module 1200 may be considered the basic building block of a multiple module cooling system. Module connector 1202-1 of vapor chamber 1202 allows an analogous vapor chamber for another cooling module (not shown) to be placed on top of cooling module 1200 and to connect (e.g. thermally and physically connect) with vapor chamber 1202 (the bottom tier cooling module). The number of tiers in such a modular cooling system depends on the power dissipated by each module 1200 and the available track height. Each module 1200 is fifteen millimeters high in some embodiments. Such a module includes a single vapor chamber (e.g. analogous to vapor chamber 1202) with the module connector (e.g. analogous to module connector 1202-1), the MEMS active tiles (e.g. analogous to tiles 1201) arranged in an array and duct work (e.g. analogous to ducts 1203) to collect the hot air for evacuation into the hot aisle. The vapor chamber module connector 1202-1 can be used to connect the upper module to the module below it in the stack. On the lowest rung of the multi-tier stack, the module connector is in thermal contact with the component(s) that are desired to be cooled. For example, in the embodiment shown in FIGS. 11A-11B, the component 1213 being cooled is a server processor (e.g. an Intel Xeon).

Although the modular nature of the cooling system is discussed in the context of cooling system 1200, other systems described herein may be modular in nature. For example, cooling systems 800, 900, 1000, and/or 1100 may be reconfigured in a modular fashion. In such embodiments, cooling systems may include apertures in which module connectors analogous to module connector 1202-1 may be provided to connect vapor chambers of different modules. Thus, cooling systems may be built out vertically or horizontally in order to satisfy the cooling needs in the space available.

Cooling system 1200 shares the benefits of cooling systems 100, 200, 300, 395, 600A, 600B, 700, 800, 900, 1000 and/or 1100. Cooling system 1200 may be used to cool high power dissipation systems. In some embodiments, cooling system 1200 may dissipate at least 300 W, 800 W. 2400 W, 3200 W, 3600 W or more while occupying less space than a traditional fan system. In addition, MEMS cooling system 1200 need not use liquids for cooling. Consequently, reliability and safety issues that may occur when using fluids for cooling electronics may be avoided. Further, an external chiller may be unnecessary. Moreover, cooling system 1200 is modular in nature. This allows increased flexibility in providing cooling solutions to multiple applications. Thus, performance, compactness, efficiency, and reliability may be improved for high power dissipation applications such as servers. Cooling system 1200 may also entrain fluid that does not travel through tiles 1201 and blend the entrained fluid with heated fluid. As a result, fluid exhausted by cooling system 1200 may have a moderate temperature.

Figure 12:
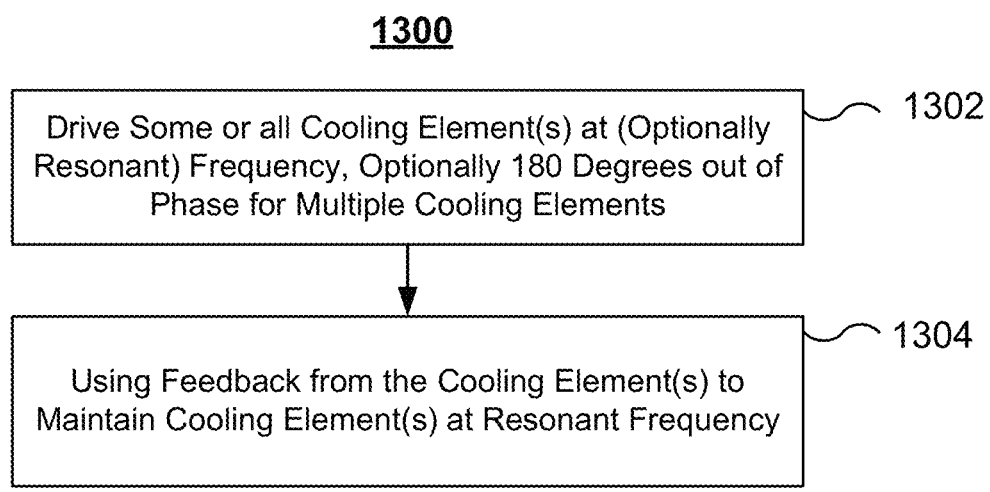
FIG. 12 is a flow chart depicting an embodiment of a method for driving flow using a MEMS cooling system.

FIG. 12 is a flow chart depicting an embodiment of method 1300 for driving flow using a MEMS cooling system. Method 1300 may include steps that are not depicted for simplicity. Method 1300 is described in the context of piezoelectric cooling systems 100 and 600B. However, method 1300 may be used with other cooling systems including but not limited to systems and cells described herein.

Some portion of the cooling elements in one or more MEMS cooling system(s) is actuated to vibrate, at 1302. Stated differently, one or more cooling cells are activated at 1302. The number of cooling elements driven at 1302 may depend upon the temperature of the heat-generating structure, the power drawn, or another parameter. In some embodiments, therefore, the number of cooling cells driven may be adjustable. In other embodiments, all of the cooling cells are driven. Also at 1302, an electrical signal having the desired frequency is used to drive the cooling element(s). In some embodiments, the cooling elements are driven at or near structural and/or acoustic resonant frequencies. The driving frequency may be 15 kHz or higher. If multiple cooling elements are driven at 1302, the cooling elements may be driven out-of-phase. In some embodiments, the cooling elements are driven substantially at one hundred and eighty degrees out-of-phase. Further, in some embodiments, individual cooling elements are driven out-of-phase. For example, different portions of a cooling element may be driven to vibrate in opposite directions (i.e. analogous to a seesaw). In some embodiments, individual cooling elements may be driven in-phase (i.e. analogous to a butterfly). In addition, the drive signal may be provided to the anchor(s), the cooling element(s), or both the anchor(s) and the cooling elements(s). Further, the anchor may be driven to bend and/or translate.

Feedback from the cooling element(s) is used to adjust the driving current, at 1304. In some embodiments, the adjustment is used to maintain the frequency at or near the acoustic and/or structural resonant frequency/frequencies of the cooling element(s) and/or cooling system. Resonant frequency of a particular cooling element may drift, for example due to changes in temperature. Adjustments made at 1304 allow the drift in resonant frequency to be accounted for.

For example, one or more cooling elements 120 of cooling system 600B may be driven at their structural resonant frequency/frequencies, at 1302. The number of cooling elements driven may be selected to efficiently cool the computing device. This resonant frequency may also be at or near the acoustic resonant frequency for top chamber 140. This may be achieved by driving piezoelectric layer(s) in anchor 160 (not shown in FIGS. 1A-1F) and/or piezoelectric layer(s) in actuator 120. At 1304, feedback is used to maintain actuator 120 at resonance and, in embodiments in which multiple actuators are driven, one hundred and eighty degrees out of phase. Thus, the efficiency of cooling element 120 in driving fluid flow through cooling system 100 and onto heat-generating structure 102 may be maintained. For similar reasons, the efficiency of cooling system 600B utilizing such cooling elements is also maintained. In some embodiments, 1304 includes sampling the current through cooling element 120 and/or the current through anchor 160 and adjusting the current to maintain resonance and low input power.

Consequently, cooling systems, such as cooling systems 100, 200, 300, 395, 600A, 600B, 700, 800, 900, 1000, and/or 1200 may operate as described herein. Method 1300 thus provides for use of piezoelectric cooling systems described herein. Thus, piezoelectric cooling systems may more efficiently and quietly cool high power computing devices.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A server system, comprising:
a vapor chamber in thermal communication with a plurality of heat sources, the vapor chamber including a plurality of external fins;
at least one array of microelectromechanical system (MEMS) jets coupled to at least one fin of the plurality of external fins, the at least one array of MEMS jets arranged to cause a fluid to impinge on a surface corresponding to the at least one fin of the plurality of external fins of the vapor chamber, the surface being selected from an external surface of the at least one fin and a heat spreader surface thermally coupled to the external surface of the at least one fin; and
a duct system coupled with the at least one array of MEMS jets and configured to direct heated fluid from proximate to the at least one fin to distal from the at least one fin.

2. The server system of claim 1, wherein the at least one array of MEMS jets includes a plurality of cooling cells, each of the plurality of cooling cells including a cooling element and an orifice plate including a plurality of orifices therein, the cooling element being configured to drive the fluid through the plurality of orifices, forming a plurality of fluid jets.

3. The server system of claim 1, wherein the fluid is air.

4. The server system of claim 1, wherein the at least one fin has a first surface and a second surface opposite to the first surface, the at least one array of MEMS jets being configured to drive the fluid toward the first surface and the second surface.

5. The server system of claim 1, wherein each of the plurality of external fins are parallel another of the plurality of external fins, and wherein the plurality of external fins is oriented parallel to a heat source surface or perpendicular to the heat source surface.

6. The server system of claim 1, wherein each of the at least one array of MEMS jets has a height of not more than 1.5 millimeter.

7. The server system of claim 1, wherein the at least one array of MEMS jets includes at least 720 jets and dissipates at least 1400 W.

8. The server system of claim 2, wherein the cooling element includes a central region and a first cantilevered region on a first side of the central region and a second cantilevered region on a second side of the central region opposite to the first side, the first and second cantilevered regions being configured to vibrate to drive the fluid through the plurality of orifices.

9. A system, comprising:
a vapor chamber in thermal communication with a plurality of heat sources, the vapor chamber including a plurality of external fins;
at least one array of cooling elements coupled to at least one fin of the plurality of external fins, the at least one array of cooling elements being configured to undergo vibrational motion when actuated to drive a fluid to impinge on a surface corresponding to the at least one fin of the vapor chamber, the surface being selected from an external surface of the at least one fin and a heat spreader surface thermally coupled to the external surface of the at least one fin, the at least one array of cooling elements configured to dissipate at least 800 Watts when actuated; and
a duct system coupled with the at least one array of cooling elements and configured to direct heated fluid from proximate to the at least one fin to distal from the at least one fin.

10. The system of claim 9, wherein the at least one array of cooling elements is configured to drive the fluid through a plurality of orifices in a least one orifice plate when actuated, forming a plurality of fluid jets.

11. The system of claim 9, wherein the at least one array of cooling elements is configured to dissipate at least 1600 Watts when actuated.

12. The system of claim 9, wherein the plurality of external fins has a first surface and a second surface opposite to the first surface, the at least one array of cooling elements being configured to cause the fluid to impinge on the first surface and the second surface.

13. The system of claim 9, each of the at least one array of cooling elements has a height of not more than 1.5 millimeter.

14. The system of claim 9, wherein the at least one array of cooling elements includes at least 720 cooling elements and dissipates at least 1400 W.

15. A method comprising:
providing a vapor chamber in thermal communication with a plurality of heat sources, the vapor chamber including a plurality of external fins;
providing at least one array of microelectromechanical system (MEMS) jets coupled with at least one fin of the plurality of external fins, the at least one array of MEMS jets arranged to cause a fluid to impinge on a surface corresponding to the at least one fin of the vapor chamber, the surface being selected from an external surface of the at least one fin and a heat spreader surface thermally coupled to the external surface of the least one fin; and providing a duct system coupled with the at least one array of MEMS jets and configured to direct heated fluid from proximate to the at least one fin to distal from the at least one fin.

16. The method of claim 15, wherein the providing the at least one array of MEMS jets includes:
providing a plurality of cooling cells, each of the plurality of cooling cells including a cooling element and an orifice plate including a plurality of orifices therein, the cooling element being configured to drive the fluid through the plurality of orifices, forming a plurality of fluid jets.

* * * * *